(12) United States Patent  
Bisognin et al.

(10) Patent No.: US 12,438,514 B2  
(45) Date of Patent: Oct. 7, 2025

(54) NEAR SYNCHRONOUS DUAL MODE SURFACE ACOUSTIC WAVE RESONATORS

(71) Applicant: RF360 SINGAPORE PTE. LTD., Republic Plaza (SG)

(72) Inventors: Aimeric Bisognin, Antibes (FR); Jacques-Antoine Damy, Nice (FR); Charles Binninger, Saint-Jeannet (FR); Matthias Pernpeintner, Grafing b. München (DE); Olivier Tristan, Antibes (FR)

(73) Assignee: RF360 Singapore Pte. Ltd., Republic Plaza (SG)

( * ) Notice: Subject to any disclaimer, the term of this patent is extended or adjusted under 35 U.S.C. 154(b) by 189 days.

(21) Appl. No.: 18/465,915

(22) Filed: Sep. 12, 2023

(65) Prior Publication Data

US 2025/0088170 A1    Mar. 13, 2025

(51) Int. Cl.
*H03H 9/02* (2006.01)
*H03H 9/145* (2006.01)
*H03H 9/25* (2006.01)
*H03H 9/64* (2006.01)

(52) U.S. Cl.
CPC .... *H03H 9/02992* (2013.01); *H03H 9/14544* (2013.01); *H03H 9/25* (2013.01); *H03H 9/6483* (2013.01); *H03H 9/6489* (2013.01)

(58) Field of Classification Search
CPC .... H03H 9/6483; H03H 9/25; H03H 9/02992; H03H 9/6436; H03H 9/02574; H03H 9/14582; H03H 9/14588; H03H 9/6433; H03H 9/0042; H03H 9/205; H03H 9/725; H03H 9/02637; H03H 9/145; H03H 9/1457; H03H 9/64; H03H 9/0057; H03H 9/0085;

(Continued)

(56) References Cited

U.S. PATENT DOCUMENTS

| | | | |
|---|---|---|---|
| 6,972,643 B2 | 12/2005 | Tsunekawa et al. | |
| 2022/0149812 A1 | 5/2022 | Pernpeintner | |
| 2022/0239281 A1* | 7/2022 | Yoon | H03H 9/6483 |

FOREIGN PATENT DOCUMENTS

WO    2017131170 A1    8/2017

OTHER PUBLICATIONS

International Search Report and Written Opinion—PCT/SG2024/050523—ISA/EPO—Dec. 3, 2024.

* cited by examiner

*Primary Examiner* — Lincoln D Donovan
*Assistant Examiner* — Tyler J Pereny
(74) *Attorney, Agent, or Firm* — Polsinelli

(57) ABSTRACT

An apparatus is disclosed for a surface acoustic wave (SAW) device a dual mode (DMS) resonator configuration with near synchronous operation. One aspect comprises a piezoelectric material, a first reflector disposed over the piezoelectric material, a second reflector disposed over the piezoelectric material, and a plurality of interdigitated transducers (IDTs) disposed over the piezoelectric material and positioned between the first reflector and the second reflector, wherein a magnitude of a pitch of electrode fingers in the first reflector and the second reflector is higher than a pitch of electrode fingers in the plurality of interdigitated transducers, wherein a variation of the pitch of the electrode fingers in the plurality of interdigitated transducers is less than 3% across the plurality of interdigitated transducers.

30 Claims, 18 Drawing Sheets

(58) Field of Classification Search
CPC .. H03H 9/02228; H03H 9/02834; H03H 9/13; H03H 9/1452; H03H 9/14541
See application file for complete search history.

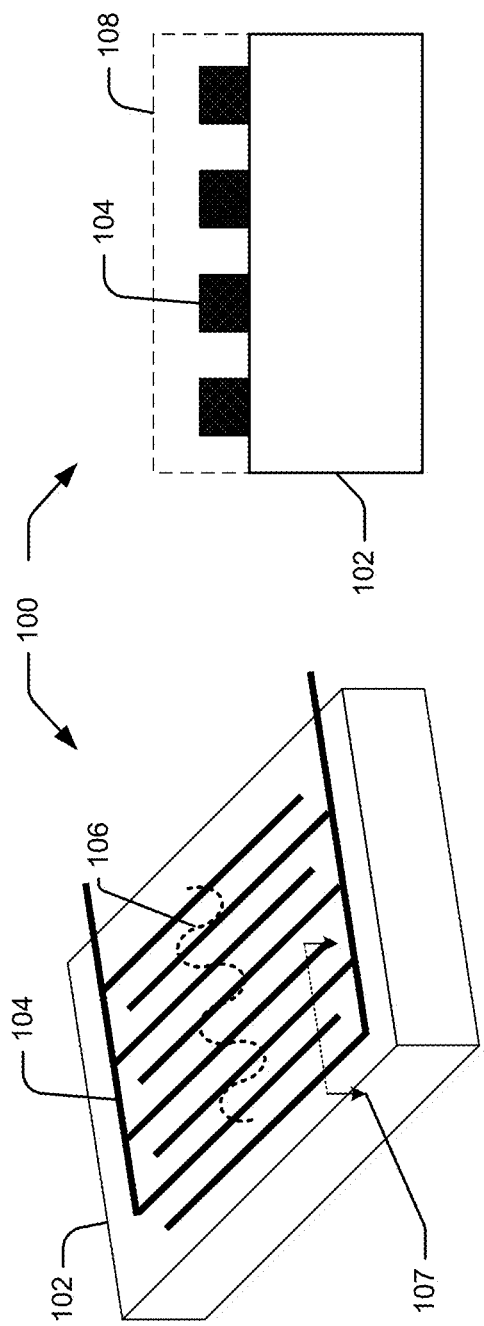

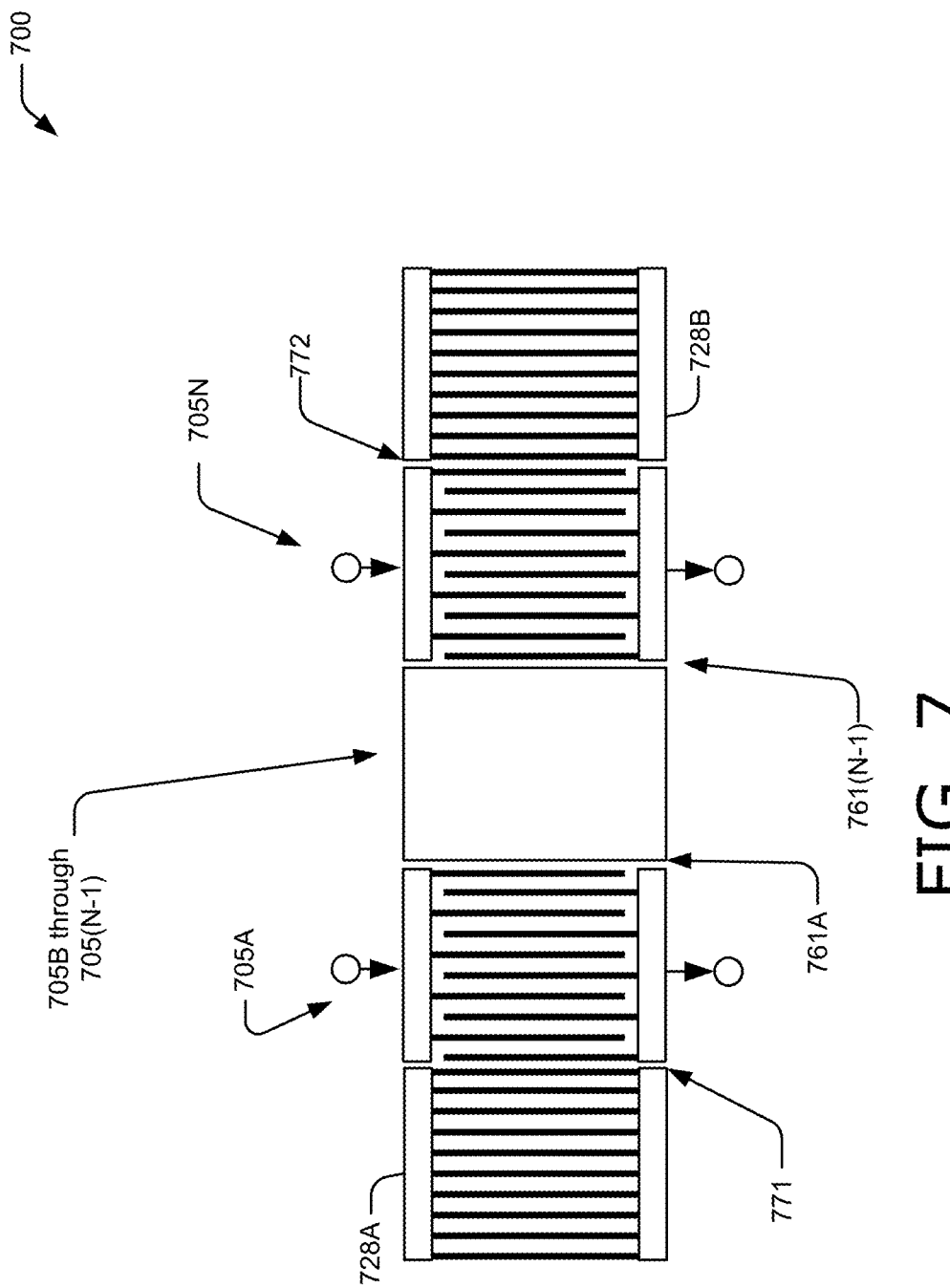

NEAR SYNCHRONOUS DUAL MODE SURFACE ACOUSTIC WAVE RESONATORS

TECHNICAL FIELD

The present disclosure relates generally to electronic communications. For example, aspects of the present disclosure relate to surface acoustic wave (SAW) resonators, and in particular, to dual mode SAW (DMS) resonators designed to reduce passband resonance spikes.

BACKGROUND

Electronic devices include traditional computing devices such as desktop computers, notebook computers, tablet computers, smartphones, wearable devices like a smartwatch, internet servers, and so forth. These various electronic devices provide information, entertainment, social interaction, security, safety, productivity, transportation, manufacturing, and other services to human users. These various electronic devices depend on wireless communications for many of their functions. Wireless communication systems and devices are widely deployed to provide various types of communication content such as voice, video, packet data, messaging, broadcast and so on. These systems may be capable of supporting communication with multiple users by sharing the available system resources (e.g., time, frequency, and power). Examples of such systems include code division multiple access (CDMA) systems, time division multiple access (TDMA) systems, frequency division multiple access (FDMA) systems, and orthogonal frequency division multiple access (OFDMA) systems, (e.g., a Long Term Evolution (LTE) system, or a New Radio (NR) system). Wireless communication transceivers used in these electronic devices generally include multiple radio frequency (RF) filters for filtering a signal for a particular frequency or range of frequencies. Electroacoustic devices (e.g., "acoustic filters") are used for filtering high-frequency (e.g., generally greater than 100 MHZ) signals in many applications. Using a piezoelectric material as a vibrating medium, acoustic resonators operate by transforming an electrical signal wave that is propagating along an electrical conductor into an acoustic wave that is propagating via the piezoelectric material. The acoustic wave propagates at a velocity having a magnitude that is significantly less than that of the propagation velocity of the electromagnetic wave. Generally, the magnitude of the propagation velocity of a wave is proportional to a size of a wavelength of the wave. Consequently, after conversion of an electrical signal into an acoustic signal, the wavelength of the acoustic signal wave is significantly smaller than the wavelength of the electrical signal wave. The resulting smaller wavelength of the acoustic signal enables filtering to be performed using a smaller filter device. This permits acoustic resonators to be used in electronic devices having size constraints, such as the electronic devices enumerated above (e.g., particularly including portable electronic devices such as cellular phones).

SUMMARY

Disclosed are systems, apparatuses, methods, and computer-readable media for electronic communications and, more specifically, to devices, wireless communication apparatuses, and circuitry implementing a dual mode surface acoustic wave (DMS).

In one aspect, an apparatus is provided. The apparatus comprises a dual mode surface acoustic wave (DMS) resonator, comprising: a piezoelectric material, a first reflector disposed over the piezoelectric material, a second reflector disposed over the piezoelectric material, a plurality of interdigitated transducers (IDTs) disposed over the piezoelectric material and positioned between the first reflector and the second reflector, where a magnitude of a pitch of electrode fingers in the first reflector and the second reflector is higher than a pitch of electrode fingers in the plurality of interdigitated transducers, where a variation of the pitch of the electrode fingers in the plurality of interdigitated transducers is less than 3% across the plurality of interdigitated transducers.

Some such aspects are configured where a metallization ratio of electrode fingers in transition regions formed by a subset of five or fewer fingers on either side of adjacent IDTs of the plurality of IDTs is greater than a metallization ratio of electrode fingers that are outside the transition regions.

In other aspects, another apparatus is provided. The apparatus comprises a dual mode surface acoustic wave (DMS) resonator, comprising: a piezoelectric material, a first reflector disposed over the piezoelectric material, a second reflector disposed over the piezoelectric material, a plurality of interdigitated transducers (IDTs) disposed over the piezoelectric material and positioned between the first reflector and the second reflector, where electrode fingers along the plurality of interdigitated transducers are formed to have a pitch profile along the plurality of interdigitated transducers that opposes formation of cavity resonance modes between adjacent interdigitated transducers of the plurality of transducers.

Some such aspects are configured where the pitch profile corresponds to near constant pitch with a change in pitch along the plurality of interdigitated transducers that is greater than zero and less than 3%. Some such aspects are configured where a magnitude of a pitch of 1 first reflector and 1 second reflector is greater than a magnitude of the pitch along the plurality of interdigitated transducers.

In other aspects, another apparatus is provided. The apparatus comprises. a dual mode surface acoustic wave (DMS) resonator, comprising: a piezoelectric material, a first interdigital transducer (IDT) disposed over a surface of the piezoelectric material, the first IDT comprising: a first busbar, a second busbar parallel to the first busbar, and a first plurality of IDT electrode fingers comprising first IDT electrode fingers extending from the first busbar toward the second busbar and second IDT electrode fingers extending from the second busbar toward the first busbar in an interdigitated configuration, and a second IDT disposed over the surface of the piezoelectric material adjacent to the first IDT along an interface region between the first IDT and the second IDT, the second IDT comprising: a third busbar, a fourth busbar parallel to the third busbar, and a second plurality of IDT electrode fingers comprising third IDT electrode fingers extending from the third busbar toward the fourth busbar and fourth IDT electrode fingers extending from the fourth busbar toward the third busbar in the interdigitated configuration, where the first IDT and the second IDT each include a transition region comprising five or fewer electrode fingers nearest the interface region, and where a chirp variation in the transition region is not zero, and where the chirp variation in the transition region is less than plus or minus three percent.

Some such aspects are configured where the five or fewer electrode fingers have a transition area metallization ratio lower or greater than a metallization ratio of electrode fingers of the first IDT and the second IDT outside the transition region. Some such aspects are configured where the transition area metallization ratio is less than fifteen percent lower or greater than the metallization ratio of the electrode fingers outside the transition region. Some such aspects are configured where the first plurality of IDT electrode fingers consists of between 7 and 15 electrode fingers, and the second plurality of IDT electrode fingers consists of between 7 and 15 electrode fingers. Some such aspects are configured where an electroacoustic cavity resonance around the first interface region between the first IDT and the second IDT is below a threshold value to limit localized energy in the transition region. Some such aspects are configured where the threshold value is set to limit localized energy in the transition region and to allow a sustained power level in the apparatus of 24 decibels (dBm) or greater.

Some such aspects are configured where a level of self-harmonic generated power in the apparatus is comparable to a level of self-harmonic generated power of a pure ladder section using a same stack with comparable insertion loss and attenuation performance.

Some such aspects are configured where a second mode of the DMS resonator is defined by a distance between the first IDT reflector and the second IDT reflector.

Some such aspects further comprise: a first IDT reflector, a second IDT reflector, where the first IDT and the second IDT are disposed between the first IDT reflector and the second IDT reflector. Some such aspects are configured where a passband of a filter formed by the DMS resonator is substantially formed based on an acoustic wave formed by the second mode between the first IDT reflector and the second IDT reflector.

Some such aspects are configured where a passband of a filter formed by the DMS resonator is substantially based on an acoustic wave formed by the first mode and the second mode.

Some such aspects further comprise a third IDT adjacent to the second IDT on an opposite side from the first IDT. Some such aspects further comprise further comprising a plurality of additional IDTs positioned with busbars along shared lines with the busbars of the first IDT and the second IDT, where each IDT of the plurality of additional IDTs is adjacent to at least one adjacent IDT.

Some such aspects are configured where a first busbar of each of the plurality of additional IDTs is coupled to a reference node, and where a second busbar of each of the plurality of additional IDTs is either coupled to an input node or an output node. Some such aspects are configured where busbars of the plurality of additional IDTs coupled to the input node are adjacent to busbars of the plurality of additional IDTs coupled to the reference node, and where busbars of the plurality of additional IDTs coupled to the output node are adjacent to busbars of the plurality of additional IDTs coupled to the reference node.

Some such aspects are configured where busbars of the plurality of additional IDTs coupled to the input node are adjacent to busbars of the plurality of additional IDTs coupled to the output node, and where busbars of the plurality of additional IDTs coupled to the reference node are adjacent to busbars of the plurality of additional IDTs coupled to the reference node. Some such aspects are configured where the first IDT, the second IDT, and the plurality of additional IDTs consists of 15 or fewer IDTs. Some such aspects are configured where each IDT of the DMS resonator has a corresponding different chirp configuration than electrode fingers of adjacent IDTs. Some such aspects are configured where the DMS resonator is disposed in a first DMS resonator element having an input node connection and an output node connection for each IDT. Some such aspects are configured where at least a first output node of the first DMS resonator element is electrically coupled to at least a first input node of a second DMS resonator element as part of a DMS resonator image-impedance circuit. Some such aspects are configured where the first DMS resonator element is associated with a different DMS resonator configuration than a DMS resonator configuration associated with the second DMS resonator element, and the DMS resonator configuration associated with the second DMS resonator element and the different DMS resonator configuration associated with the first DMS resonator element are configured for an impedance match with susceptance close to zero at an inner reference plane connection between at least the first output node of the first DMS resonator element and at least the first input node of the second DMS resonator element. Some such aspects are configured where at least the first output node of the first DMS resonator element and at least a first input node of the first DMS resonator element are coupled via a first capacitor, and at least the first input node of the second DMS resonator element and at least a first output node of the second DMS resonator element are coupled via a second capacitor. Some such aspects are configured where the first capacitor has a capacitance value between 0 and 1 picofarad (pF) selected to fine tune an antiresonance frequency of a mode of the DMS resonator.

Some such aspects are configured where the DMS resonator is used in a transmission filter of a wireless communication apparatus configured for a power handling of at least 24 decibels (dBm).

Some such aspects are configured where the DMS resonator is disposed in a filter of a wireless communication apparatus.

This summary is not intended to identify key or essential features of the claimed subject matter, nor is it intended to be used in isolation to determine the scope of the claimed subject matter. The subject matter should be understood by reference to appropriate portions of the entire specification of this patent, any or all drawings, and each claim.

The foregoing, together with other features and embodiments, will become more apparent upon referring to the following specification, claims, and accompanying drawings.

BRIEF DESCRIPTION OF DRAWINGS

FIG. 1A is a diagram of a perspective view of an example of an electroacoustic device.

FIG. 1B is a diagram of a side view of the electroacoustic device of FIG. 1A.

FIG. 7 is a diagram of a DMS resonator structure with two reflectors and an arbitrary number (N) of electroacoustic transducers in accordance with some aspects described herein.

DETAILED DESCRIPTION

Figure 2A:
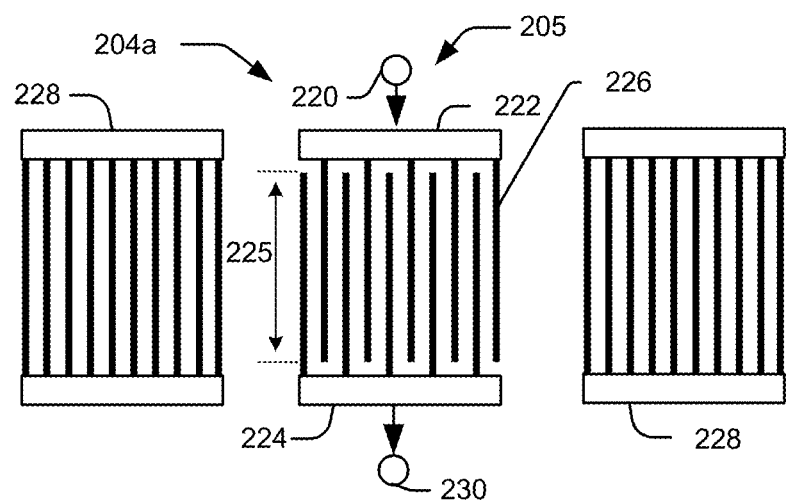
FIG. 2A is a diagram of a top view of an example of an electrode structure of an example electroacoustic device.

The detailed description set forth below in connection with the appended drawings is intended as a description of example implementations and is not intended to represent the only implementations in which the invention may be practiced. The detailed description includes specific details for the purpose of describing aspects of surface acoustic wave (SAW) devices in a configuration for near synchronous dual mode operation.

Electroacoustic devices (e.g., "acoustic filters") can be used to filter high-frequency (e.g., generally greater than 100 MHZ) signals in many applications. An electroacoustic filter is tuned to pass certain frequencies (e.g., frequencies within its passband) and attenuate other frequencies (e.g., frequencies that are outside of its passband). Using a piezoelectric material as a vibrating medium in a transducer, the acoustic filter operates by transforming an electrical signal wave that is propagating along an electrical conductor into an acoustic wave (e.g., an acoustic signal wave) that forms across the piezoelectric material. The acoustic wave is then converted back into an electrical filtered signal. The cellular communication market, in particular, uses such electroacoustic devices. Within the cellular market, the market for wearable devices is growing at a very high rate. Aspects described herein can provide an improvement to such wearable devices, where very light and small devices with very high efficiency are prioritized over devices consuming higher power.

The acoustic wave propagates across the piezoelectric material at a velocity having a magnitude that is significantly less than that of the propagation velocity of the electrical wave. Generally, the magnitude of the propagation velocity of a wave is proportional to a size of a wavelength of the wave. Consequently, after conversion of the electrical signal wave into the acoustic wave, the wavelength of the acoustic wave is significantly smaller than the wavelength of the electrical signal wave. The resulting smaller wavelength of the acoustic wave enables filtering to be performed using a smaller filter device. This permits acoustic filters to be used in space-constrained devices, including portable electronic devices such as cellular phones.

Dual mode surface acoustic wave (DMS) resonators operate generally as described above, but with multiple adjacent electroacoustic transducers positioned between reflector structures. A single transducer between two reflectors (e.g., non-DMS SAW resonator operation) can generate a single mode between the reflectors (e.g., a synchronous resonator mode). The use of multiple transducers in DMS devices allows multiple resonance modes (e.g., the synchronous resonator mode between the outer reflectors, and one or more additional modes associated with the configuration of the multiple transducers in the DMS resonator). The multiple resonance modes can be configured in a design to synthesize a filter passband, allowing further size reduction, and/or passband performance improvements beyond what can be generated using a single transducer SAW device.

Some DMS resonators include cavities between adjacent transducers, and a significant asynchronous design element, with up to 20% pitch variation (e.g., chirp, or the space between transducer fingers as described in more detail below) within the design of a single DMS resonator. Such cavity and/or chirp configurations can result in strong spurious modes in a passband range through excitation of a spurious parasitic mode (e.g., shear, Rayleigh, etc.) near the mode between the reflectors for certain resonator layer stacks.

Aspects described include DMS transducer configurations to limit or remove such passband spikes. In some aspects, a DMS resonator is designed with an almost constant finger period (e.g., for fingers of interdigital transducers of the electroacoustic resonators) at the junctions between adjacent transducers. In some aspects, the DMS filter passband synthesis is performed using two modes resonating in the cavity formed by two outer reflector structures (e.g., the mode between the reflectors and a second mode within the IDTs as described below.) The transducer finger configuration reduces or eliminates cavity mode formed by gaps between adjacent transducers. The resonance frequency of the cavity mode can be configured at higher frequencies where spurious parasitic modes do not impact resonator performance. Such DMS resonator filter can be optimized by adjusting an aperture (e.g., impedance), a number of transducer fingers (e.g., impedance, bandwidth, attenuation), transducer and reflector finger periods (e.g., frequency and reflector stopbands), and the transducer gap distances (e.g., bandwidth).

In addition to the benefits described above, in some aspects, a DMS resonator configured for near synchronous operation can provide manufacturing benefits associated with SiO$_2$ gap filling behavior. In particular, as described herein, conventional DMS resonators have a transition area between IDTs where fingers adjacent to the transition line between IDTs have a higher frequency (e.g., less space between the IDT fingers). For certain frequency bands, the design of a certain IDT approaches or passes the limits of the manufacturability for finger pitch. DMS resonators described herein can be designed for such frequency bands without such high frequency finger pitch configurations.

The benefits can be accompanied by certain configurations where DMS resonators configured for almost synchronous performance can have reduced insertion loss performance, a lower maximum achievable bandwidth, and a higher impedance for DMS resonators with smaller numbers of IDTs. In some aspects, impedance issues can be compensated for by increasing the number of IDTs in a DMS resonator or combining aspects described herein with other resonators for implementations where the limits associated with the described aspects impact performance (e.g., filters using combinations of near synchronous IDTs with conventional IDTs).

Aspects of DMS resonator packaging is described, and in some aspects, multiple DMS packages in accordance with aspects described herein can be cascaded in an image-impedance connection configuration. In some aspects, additional tuning circuitry can be provided.

Various aspects of the present disclosure will be described with respect to the figures.

FIG. 1A is a diagram of a perspective view of an example of an electroacoustic transducer 100. The electroacoustic transducer 100 may be configured as, or be a portion of, a SAW resonator. In certain descriptions herein, the electroacoustic transducer 100 may be referred to as a SAW resonator. The electroacoustic transducer 100 includes an electrode structure 104, that may be referred to as an interdigital transducer (IDT), on the surface of a piezoelectric material 102. The electrode structure 104 generally includes first and second comb shaped electrode structures (conductive and generally metallic) with electrode fingers extending from two busbars towards each other arranged in an interlocking manner in between two busbars (e.g., arranged in an interdigitated manner). An electrical signal excited in the electrode structure 104 (e.g., applying an AC voltage) is transformed into an acoustic wave 106 that propagates in a particular direction via the piezoelectric material 102. The acoustic wave 106 is transformed back into an electrical signal and provided as an output. In many applications, the piezoelectric material 102 has a particular crystal orientation such that when the electrode structure 104 is arranged relative to the crystal orientation of the piezoelectric material 102, the acoustic wave mainly propagates in a direction perpendicular to the direction of the fingers (e.g., parallel to the busbars).

FIG. 1B is a diagram of a side view of the electroacoustic transducer 100 of FIG. 1A, along a cross-section 107 shown in FIG. 1A. The electroacoustic transducer 100 is illustrated by a simplified layer stack including a piezoelectric material 102 with an electrode structure 104 disposed on the piezoelectric material 102. The electrode structure 104 is conductive and generally formed from metallic materials. The piezoelectric material may be formed from a variety of materials such as quartz, lithium tantalate (LiTaO3), lithium niobate (LiNbO3), doped variants of these, or other piezoelectric materials. It should be appreciated that more complicated layer stacks (e.g., four (4) layers, six (6) layers, etc.), including layers of various materials, may be possible within the stack. For example, optionally, a temperature compensation layer 108 (denoted by the dashed lines) may be disposed above the electrode structure 104. The piezoelectric material 102 may be extended with multiple interconnected electrode structures disposed thereon to form a multi-resonator filter or to provide multiple filters. While not illustrated, when provided as an integrated circuit component, a cap layer may be provided over the electrode structure 104. The cap layer is applied so that a cavity is formed between the electrode structure 104 and an under surface of the cap layer. Electrical vias or bumps that allow the component to be electrically connected to connections on a substrate (e.g., via flip-chip or other techniques) may also be included.

FIG. 2A is a diagram of a top view of an example of an electrode structure 204$a$ of the electroacoustic transducer 100 configured with two reflectors 228 in a non-DMS configuration. FIG. 2A generally illustrates a one-port configuration. The electrode structure 204$a$ has an IDT 205 that includes a first busbar 222 (e.g., first conductive segment or rail) electrically connected to a first terminal 220 and a second busbar 224 (e.g., second conductive segment or rail) spaced from the first busbar 222 and connected to a second terminal 230. A plurality of conductive fingers 226 are connected to either the first busbar 222 or the second busbar 224 in an interdigitated manner. Fingers 226 connected to the first busbar 222 extend towards the second busbar 224 but do not connect to the second busbar 224 so that there is a small gap between the ends of these fingers 226 and the second busbar 224. Likewise, fingers 226 connected to the second busbar 224 extend towards the first busbar 222 but do not connect to the first busbar 222 so that there is a small gap between the ends of these fingers 226 and the first busbar 222.

In the direction along a shared line parallel to the busbars 222 and 224, there is an overlap region including a central region where a portion of one finger overlaps with a portion of an adjacent finger (as illustrated by the central region 225). The central region 225 including the overlap may be referred to as the aperture, track, or active region where electric fields are produced between fingers 226 to cause an acoustic wave to propagate in the piezoelectric material 102. The periodicity of the fingers 226 is referred to as the pitch of the IDT. The pitch may be indicted in various ways. For example, in certain aspects, the pitch may correspond to a magnitude of a distance between fingers in the central region 225. The distance may be defined, for example, as the distance between center points of each of the fingers (and may be generally measured between a right (or left) edge of one finger and the right (or left) edge of an adjacent finger when the fingers have uniform thickness). As described herein, a "higher" pitch refers to sections of an IDT where electrode fingers have greater distances between adjacent electrode fingers, and a "lower" pitch refers to sections of an IDT where electrode fingers have lower distances between adjacent electrode fingers. In certain aspects, an average of distances between adjacent fingers may be used for the pitch. Having sections of an IDT with electrode fingers having a given pitch characteristic different from pitch characterizations of other sections of an IDT allows for selection or control of the signals (e.g., waves) that propagate through the IDT. The frequency at which the piezoelectric material vibrates is a self-resonance (also called a "main-resonance") frequency of the electrode structure 204$a$. The frequency is determined at least in part by the pitch of the IDT 205 and other properties of the electroacoustic transducer 100.

In some examples, the pitch characteristics of sections of an IDT can be a constant pitch, where the pitch does not vary significantly over the IDT section (e.g., variances are within manufacturing tolerances, and are designed for a constant average pitch). In other examples, pitch characteristics of an IDT section can include a "chirped" pitch, where the pitch varies in a predefined way over the IDT section. For example, a chirped pitch can include an IDT section where the pitch is designed to change linearly across the IDT section, such that the pitch at one end of the IDT section is at a first value, the pitch at an opposite end of the IDT section is at a second value, and the pitch (e.g., the distance between electrode fingers) changes linearly between the two ends of the IDT section. In other examples, other non-linear variations in pitch value across an IDT section can be used. By combining IDT sections with different pitch characteristics (e.g., a constant pitch at a first value and a constant pitch at a second value, or a constant pitch at a first value in one IDT section and a chirped pitch across a second IDT section), the resonator characteristics can be designed for a given performance as described herein.

The IDT 205 is arranged between two reflectors 228 which reflect the acoustic wave back towards the IDT 205 for the conversion of the acoustic wave into an electrical signal via the IDT 205 in the configuration shown and to prevent losses (e.g., confine and prevent escaping acoustic waves). Each reflector 228 has two busbars along shared lines with corresponding busbars for the IDT 205 and a grating structure of conductive fingers that each connect to both busbars. The pitch of the reflector may be similar to or the same as the pitch of the IDT 205 to reflect acoustic waves in the resonant frequency range. But many configurations are possible.

When converted back to an electrical signal, the measured admittance or reactance between both terminals (i.e. the first terminal 220 and the second terminal 230) serves as the signal for the electroacoustic transducer 100.

Figure 2B:
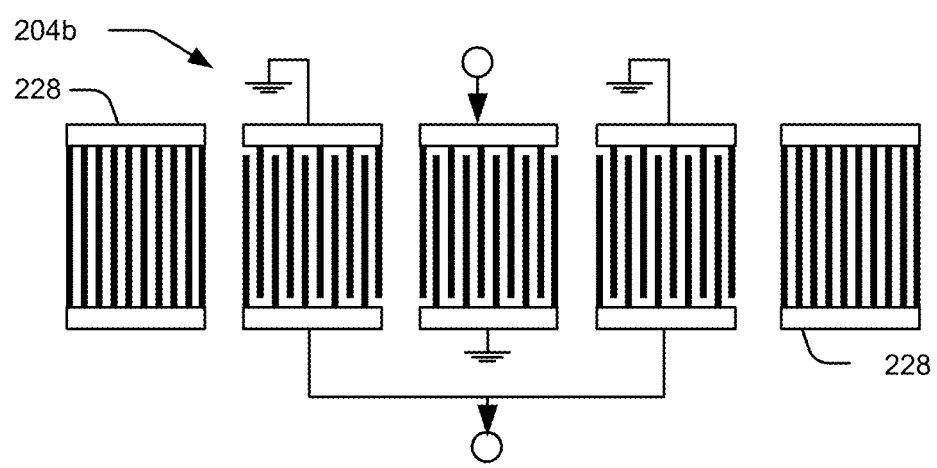
FIG. 2B is a diagram of a top view of an example of an electrode structure of an example electroacoustic device.

FIG. 2B is a diagram of a top view of another example of an electrode structure 204b of an electroacoustic device. In this case, an the electrode structure 204b includes a central IDT along with reflectors 228 connected as illustrated. The electrode structure 204b is provided to illustrate the variety of electrode structures and connections for structures that can be used in accordance with aspects described herein.

It should be appreciated that while a certain number of fingers 226 are illustrated, the number of actual fingers and lengths and width of the fingers 226 and busbars may be different in an actual implementation. Such parameters depend on the particular application and desired frequency of the filter. In addition, a SAW filter may include multiple interconnected electrode structures each including multiple IDTs to achieve a desired passband (e.g., multiple interconnected resonators or IDTs to form a desired filter transfer function).

Figure 3A:
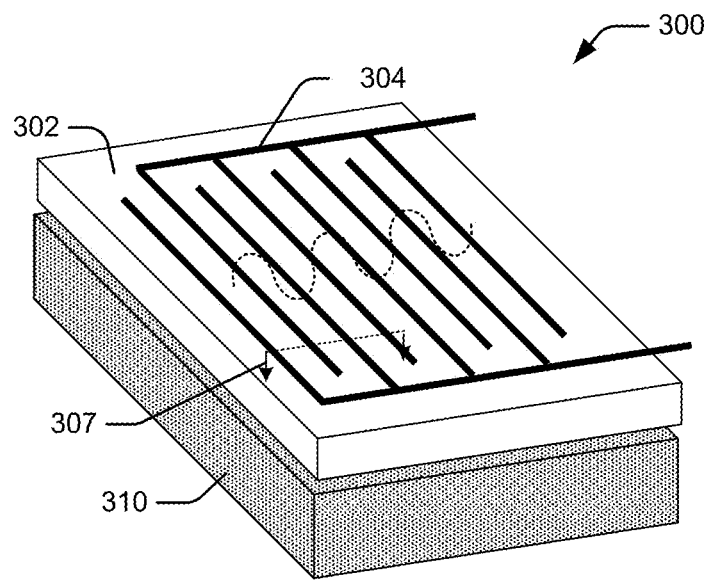
FIG. 3A is a diagram of a perspective view of another example of an electroacoustic device.

FIG. 3A is a diagram of a perspective view of another example of an electroacoustic device 300. The electroacoustic device 300 (e.g., that may be configured as or be a part of a SAW resonator) is similar to the electroacoustic transducer 100 of FIG. 1A, but has a different layer stack. In particular, the electroacoustic device 300 includes a thin piezoelectric material 302 that is provided on a substrate 310 (e.g., silicon). Based on the type of piezoelectric material 302 used (e.g., typically having higher coupling factors relative to the electroacoustic transducer 100 of FIG. 1A) and a controlled thickness of the piezoelectric material 302, the particular acoustic wave modes excited may be slightly different than those in the electroacoustic transducer 100 of FIG. 1A. Based on the design (thicknesses of the layers, and selection of materials, etc.), the electroacoustic device 300 may have a higher Q-factor as compared to the electroacoustic transducer 100 of FIG. 1A. The piezoelectric material 302, for example, may be Lithium tantalate (LiTaO3) or some doped variant. Another example of a piezoelectric material 302 for FIG. 3A may be Lithium niobite (LiNbO3). In general, the substrate 310 may be substantially thicker than the piezoelectric material 302 (e.g., potentially on the order of 50 to 100 times thicker as one example—or more). The substrate 310 may include other layers as 310-1, 310-2, and 310-3 (or other layers may be included between the substrate 310 and the piezoelectric material 302).

Figure 3B:
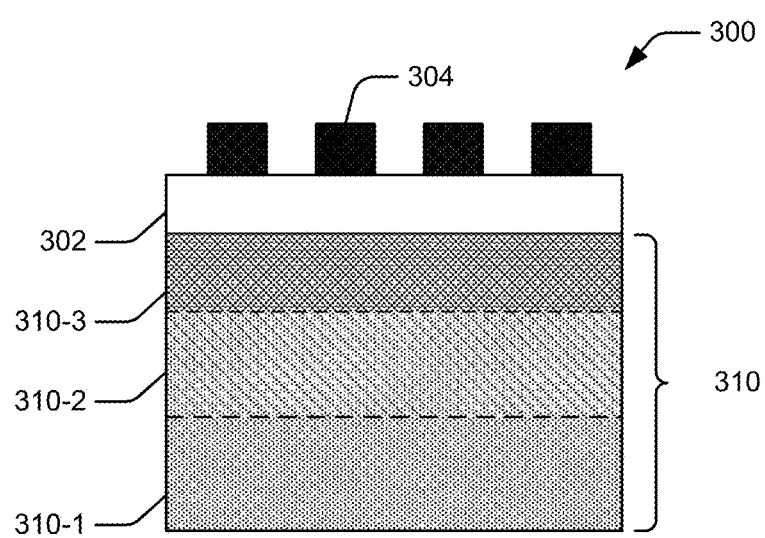
FIG. 3B is a diagram of a side view of the electroacoustic device of FIG. 3A.

FIG. 3B is a diagram of a side view of the electroacoustic device 300 of FIG. 3A showing an example of a layer stack (along a cross-section 307). In the aspect shown in FIG. 3B, the substrate 310 may include sublayers such as a substrate sublayer 310-1 (e.g., of silicon) that may have a higher resistance (e.g., relative to the other layers-high resistivity layer). The substrate 310 may further include a trap rich layer 310-2 (e.g., poly-silicon, aluminum nitride (AlN), silicon nitride (SiN4), diamond-like carbon (DLC), and dielectric films with a high sound velocity). The substrate 310 may further include a compensation layer (e.g., silicon dioxide ($SiO_2$) or another dielectric material) that may provide temperature compensation and other properties. These sub-layers may be considered part of the substrate 310 or their own separate layers. A relatively thin piezoelectric material 302 is provided on the substrate 310 with a particular thickness for providing a particular acoustic wave mode (e.g., as compared to the electroacoustic transducer 100 of FIG. 1A where the thickness of the piezoelectric material 102 may not be a significant design parameter beyond a certain thickness and may be generally thicker as compared to the piezoelectric material 302 of the electroacoustic device 300 of FIGS. 3A and 3B). The electrode structure 304 is positioned above the piezoelectric material 302. In addition, in some aspects, there may be one or more layers (not shown) possible above the electrode structure 304 (e.g., such as a thin passivation layer).

Based on the type of piezoelectric material, the thickness, and the overall layer stack, the electromechanical coupling to the electrode structure 304 and acoustic velocities within the piezoelectric material in different regions of the electrode structure 304 may differ between different types of electroacoustic devices such as between the electroacoustic transducer 100 of FIG. 1A and the electroacoustic device 300 of FIGS. 3A and 3B.

Figure 4:
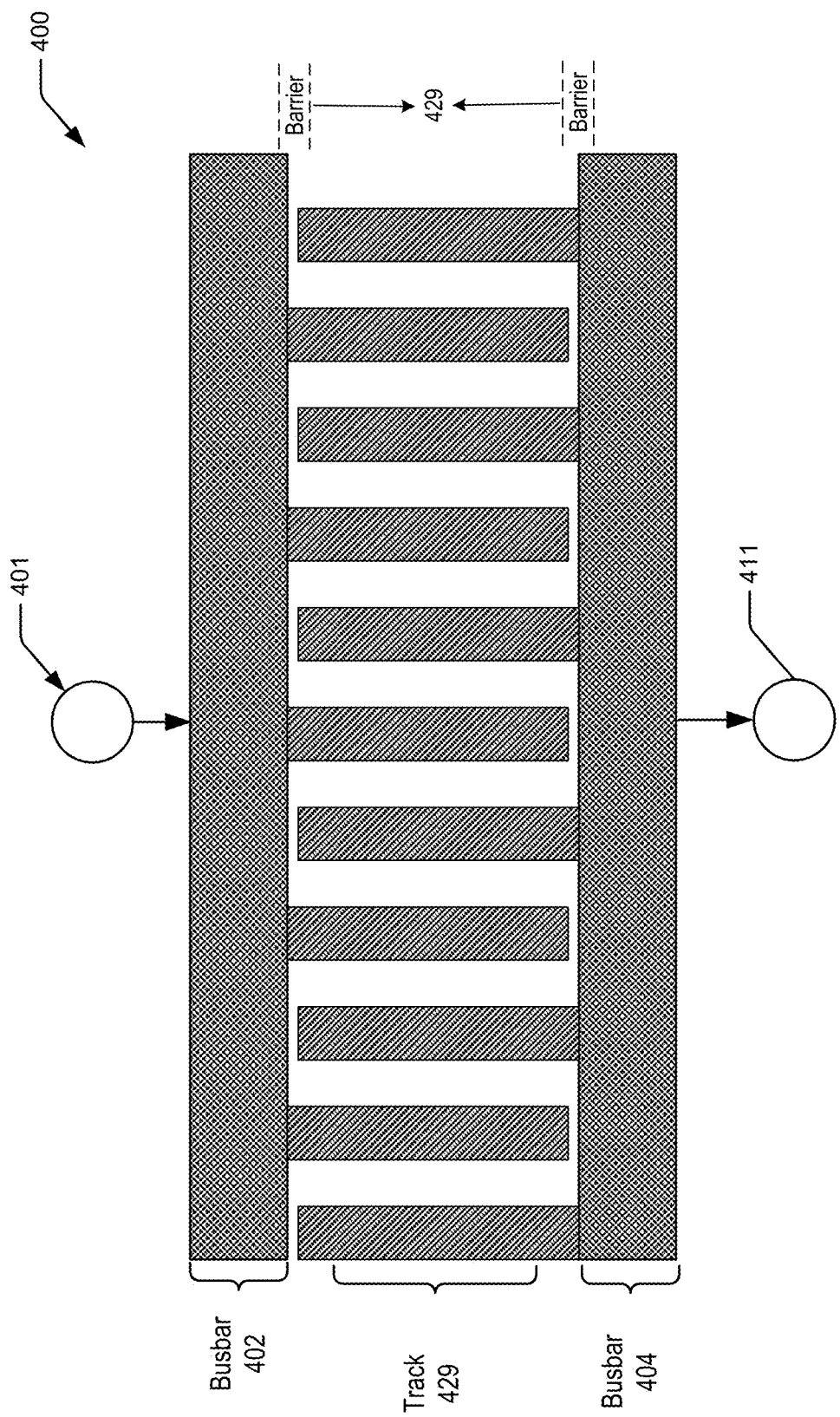
FIG. 4 is a diagram of a view of an example electrode structure of an interdigital transducer (IDT) that can be used in a DMS resonator in accordance with aspects described herein.

FIG. 4 is a diagram of a view of an example electrode structure 400 of an interdigital transducer (IDT) that can be used in a DMS in accordance with aspects described herein. Just as above, the electrode structure 400 may be referred to as an IDT that can be fabricated on the surface of a piezoelectric material as part of the resonator. The electrode structure 400 includes first and second comb shaped electrodes. The comb teeth are within track 429, and supported by busbar 402 on one side and busbar 404 on the other side. An electrical signal excited across the resonator by an electrical signal at input node 401 is transformed into an acoustic wave that propagates within the resonator. The acoustic wave is transformed back into an electrical signal at the output node 411. The outer reflectors (e.g., reflectors 228, not shown in FIG. 4) will have a similar configuration, but without the barrier, so that each finger of the reflectors couples across the track region to connect with both busbars.

As described above, multiple electrode structures 400 can be configured between outer reflectors using the SAW details provided above for a dual mode SAW (DMS) resonator.

Figure 5A:
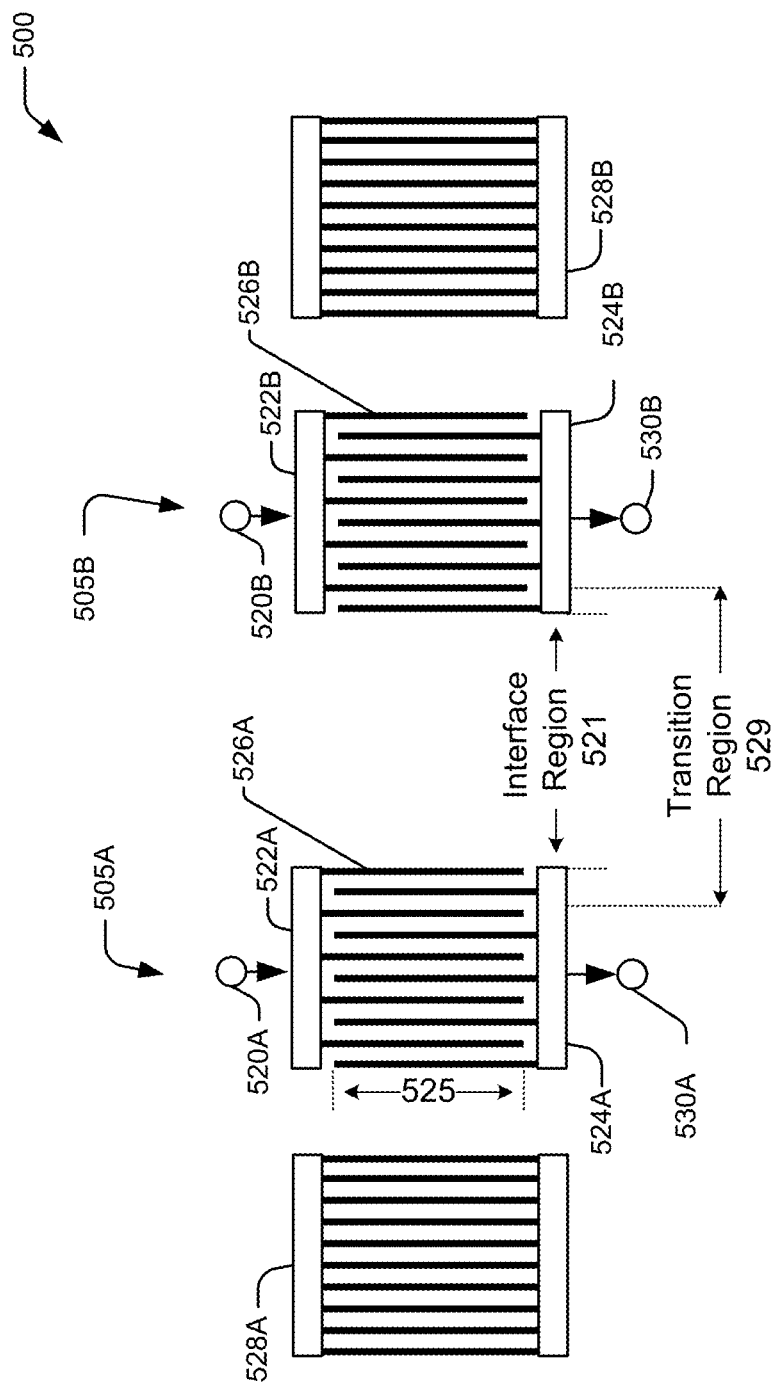
FIG. 5A is a diagram of a DMS resonator with two reflectors and two electroacoustic transducers in accordance with some aspects described herein.

FIG. 5A is a diagram of a DMS resonator 500 with two reflectors 528A, 528B and two electroacoustic interdigital transducers (IDTs) 505A, 505B in accordance with some aspects described herein. Just as with FIGS. 2A and 2B FIG. 5A can be considered a diagram of a top view of an example of a resonator structure. FIG. 5A illustrates a DMS resonator 500. The interface region between the two IDTs 505A, 505B is not proportional. Each of the IDTs 505A, 505B includes a first corresponding busbar 522A, 522B (e.g., first conductive segment or rail) electrically connected to a first terminal 520A, 520B and a second busbar 524A, 524B (e.g., second conductive segment or rail) spaced from the first busbar 522A, 522B and connected to a second terminal 530A, 530B. A plurality of corresponding conductive fingers 526A, 526B for each of the IDTs 505A, 505B include busbars, with adjacent fingers coupled to opposite busbars in an interdigitated manner. Similar to FIG. 4, a central track region 525 of the conductive fingers provides a primary electroacoustic region for signal modes in IDTs of the DMS resonator 500.

In addition to having multiple IDTs 505A, 505B, FIG. 5A illustrates an interface region between the IDTs 505A, 505B in the DMS resonator 500. FIG. 5A additionally illustrates a transition region 529 between the IDTs 505A and 505B, which includes electrode fingers of each IDT 505A, 505B nearest the element transition region 529 associated with the two IDTs 505A, 505B. In some aspects, the transition region 529 includes no electrode fingers. In other aspects, the transition region of a DMS resonator with near synchronous operation includes up to two electrode fingers from each associated IDT on either side of a transition line between two IDTs. In other aspects, five or fewer electrode fingers are included in the transition region, with metallization and/or spacing different than the metallization and/or spacing outside the transition region. The DMS resonator 500 can be configured in a number of different ways in accordance with the details described above. The variables for configuring the passband of the DMS resonator 500 and other operating characteristics can include chirp or finger distance values associated with the interface region 521 (e.g., distances between fingers of adjacent IDTs around the interface region), variations in finger pitch and metallization ratios along any portion of any element of the DMS resonator 500 (e.g., reflectors 528A, 528B and IDTs 505A, 505B), a number of fingers 526A, 526B for any IDT of the DMS resonator 500, chirp (e.g., finger pitch) values along any portion of any element of the DMS resonator 500, a number of fingers or pitch in the reflectors 528A, 528B, or any other such characteristics of a DMS resonator such as the DMS resonator 500 described herein. While the DMS resonator 500 includes two IDTs 505A, 505B, other aspects can include any number of IDTs. In some aspects, a DMS resonator can be configured with between three and fifteen IDTs between a pair of reflectors, as illustrated further below. Each pair of adjacent IDTs will have an associated interface region 521 area which impacts resonance while providing electrically isolated inputs and outputs illustrated in FIG. 5A as input terminals 520A, 520B and output terminals 530A, 530B.

Figure 5B:
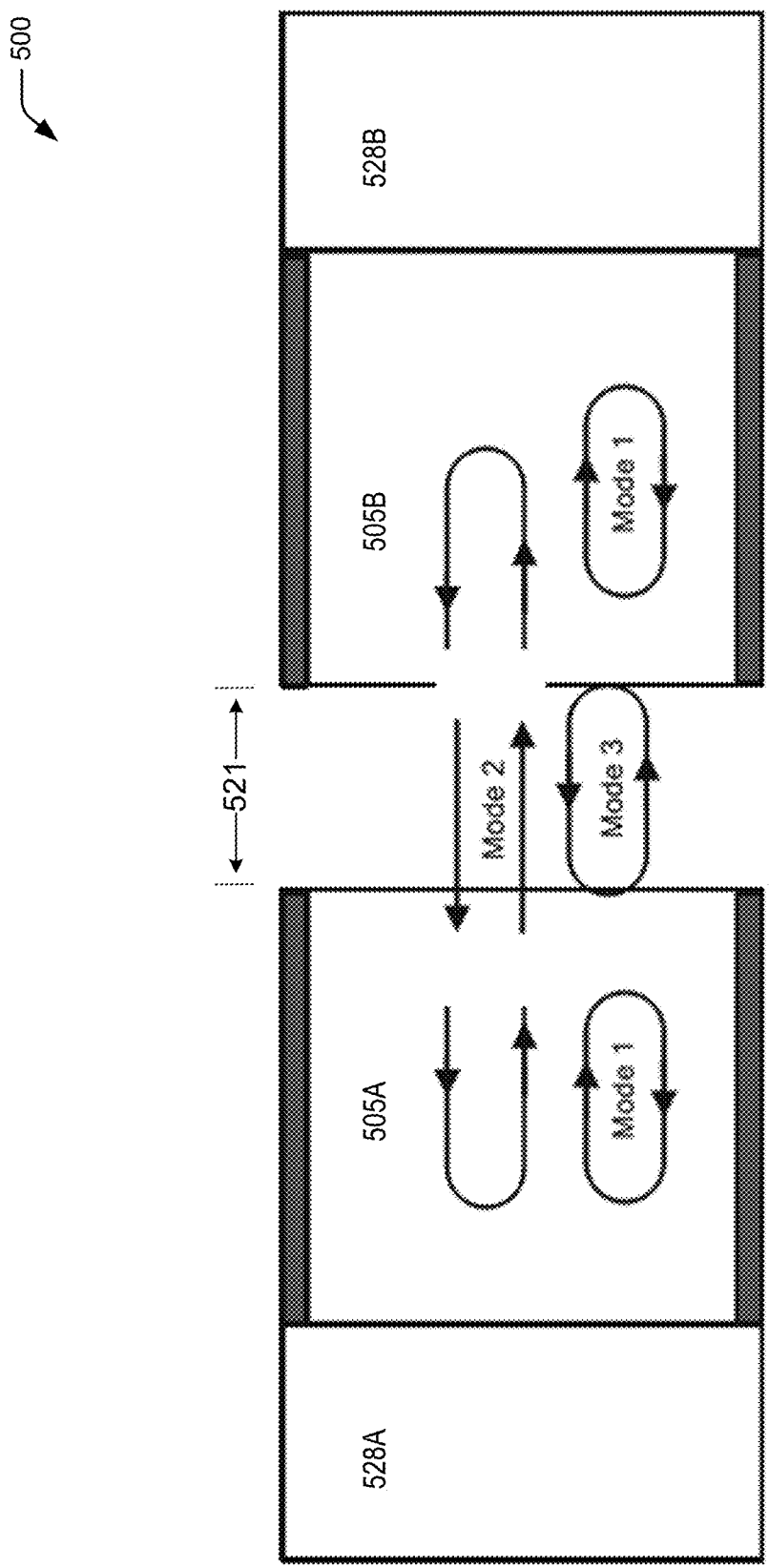
FIG. 5B illustrates aspects of a DMS resonator in accordance with aspects described herein.

FIG. 5B illustrates aspects of the DMS resonator 500 in accordance with aspects described herein. FIG. 5B illustrates at a high level the acoustic modes that dominate passband operation due to the various elements of the DMS resonator 500. The reflectors 528A and 528B are shown, along with the two IDTs 505A and 505B. As described above, conventional DMS resonators are configured with the interface region 521 (e.g., cavity region between IDTs) having a significant variation in finger period at the transition between IDTs (e.g., the chirp at the transition between the adjacent IDTs). FIG. 5B illustrates a configuration with a interface region 521, where a cavity mode 3 is present, in addition to the mode 2 between the reflectors 528A, 528B, and a mode 1 within each of the IDTs 505A, 505B. The mode 2 pitch results from resonances inside the constant pitch region(s) of the transducers (e.g., where multiple reflections between the fingers of the synchronous part of the IDTs are exiting the mode 2). The mode 1 can include a higher order mode primarily caused by reflections between the reflectors. The mode 3 in the interface region 521 can occur due to a large chirp associated with the interface region 521 such as a variation of the finger period of 10 to 20% or greater. In some aspects, the mode 3 results in excitation of spurious parasitic modes, which can result in a spike with several decibels (dB) in a passband range of the DMS resonator 500.

Figure 5C:
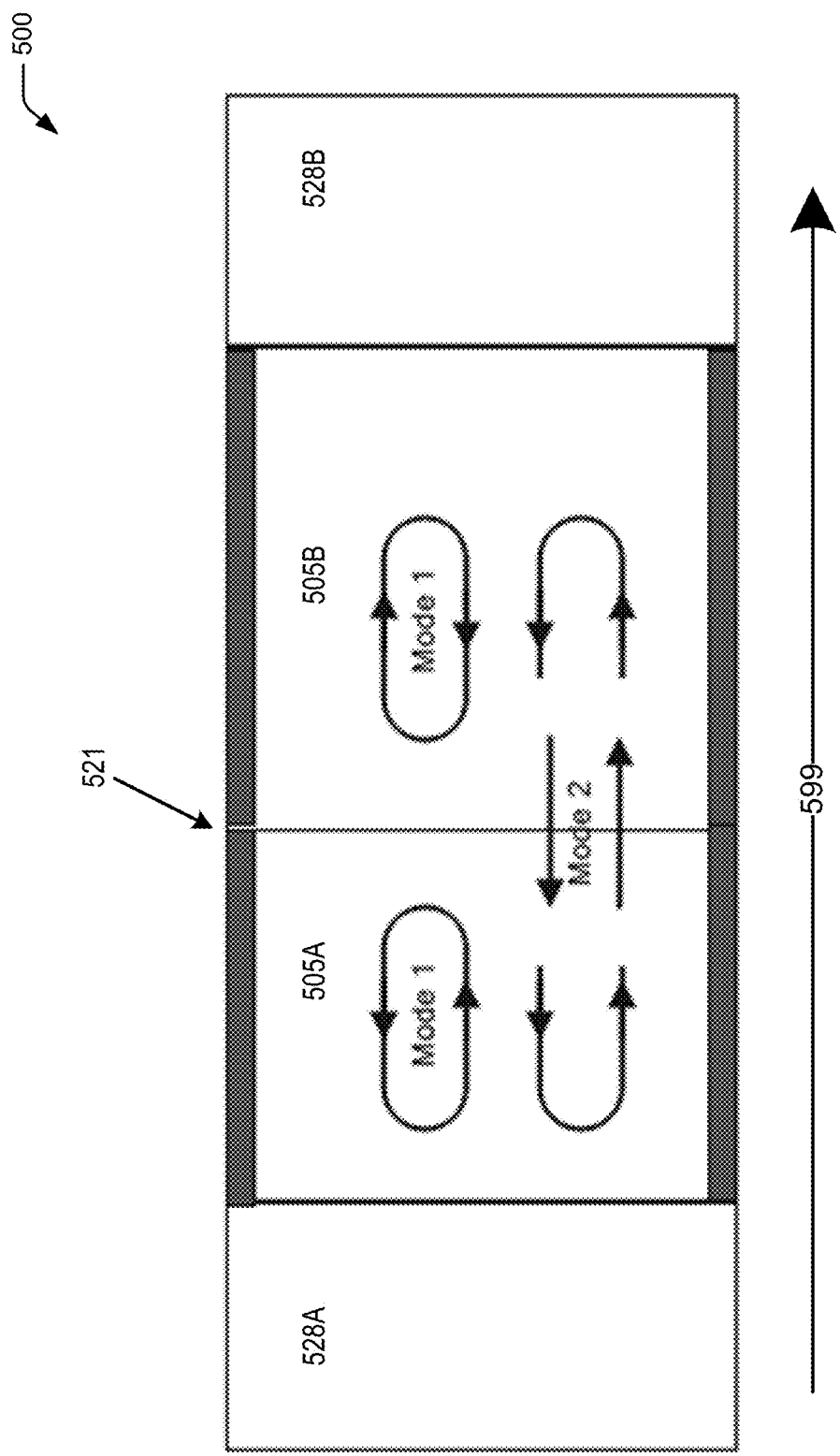
FIG. 5C illustrates aspects of a near synchronous DMS resonator in accordance with aspects described herein.

FIG. 5C illustrates aspects of the DMS resonator 500 configured for near synchronous operation (e.g., having little pitch variation) to limit the interface region 521 in accordance with aspects described herein. As illustrated, the DMS resonator 500 of FIG. 5C includes the reflectors 528A, 528B, and the IDTs 505A, 505B, but with the interface region 521 limited, minimized, or eliminated by device configuration. As illustrated, the reflectors 528A, 528B are present as well as the two IDTs 505A, 505B, but the transition area associated with the interface region 521 is designed to eliminate the mode 3 of FIG. 5B, leaving the mode 2 and mode 1 electroacoustic signals to dominate performance. In addition to showing the above details of the DMS resonator 500, FIG. 5C includes an axis 599 illustrating a direction of a shared line parallel to the busbars of the DMS resonator (e.g., both IDT and reflector busbars) from a start of the reflector 528A along the two IDTs 505A, 505B to the end of the reflector 528B, which is used to describe configuration for near synchronous operation of the DMS resonator 500 below.

Figure 5D:
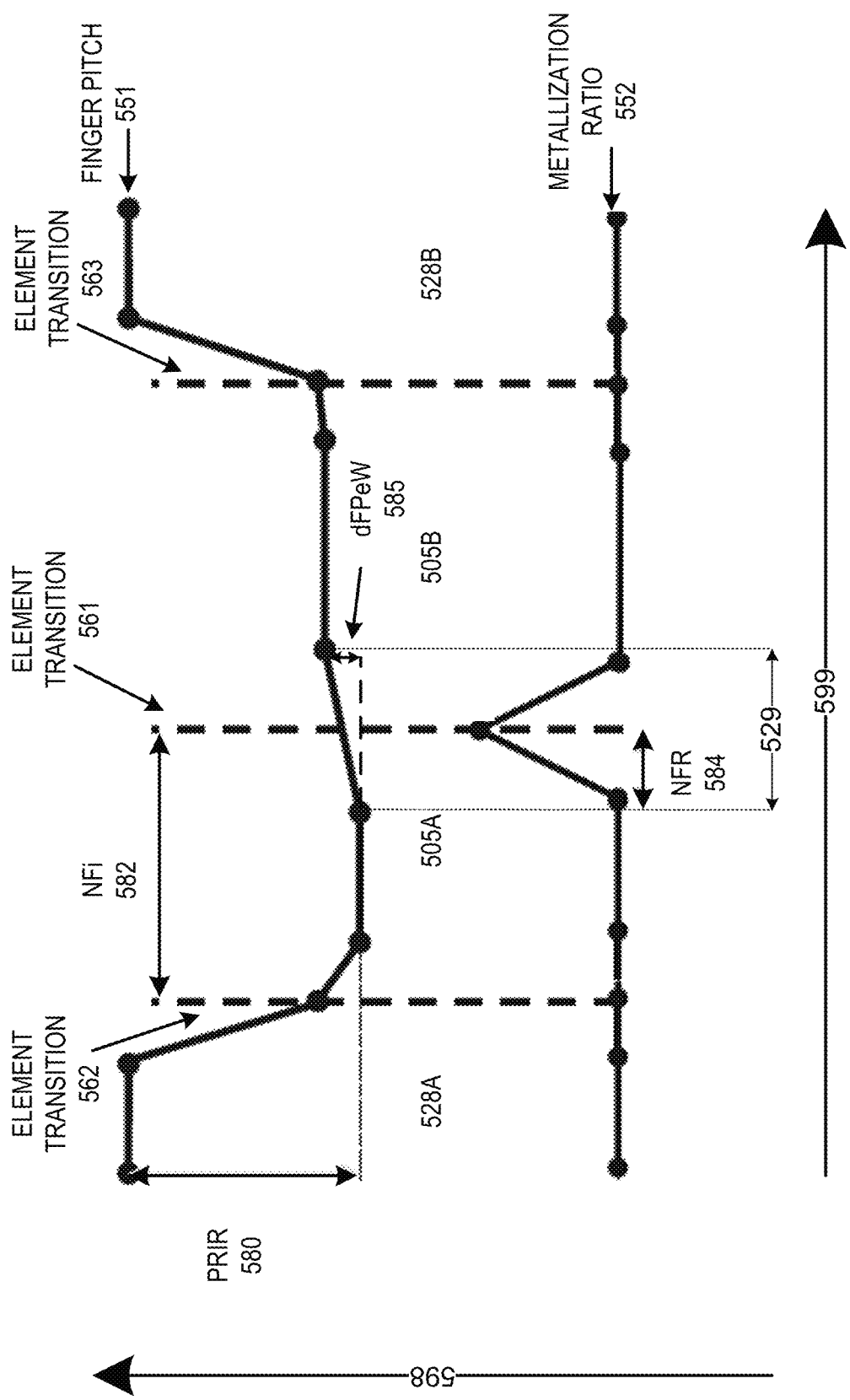
FIG. 5D is a chart illustrating details of a DMS resonator configured for near synchronous operation in accordance with aspects described herein.

FIG. 5D is a chart illustrating details of a DMS resonator configured for near synchronous operation in accordance with aspects described herein. The chart includes areas associated with the reflectors 528A, 528B and IDTs 505A, 505B, corresponding to the distance along the DMS resonator 500 as illustrated by the axis 599 which is also shown in FIG. 5C. The finger pitch line 551 shows a relative finger pitch associated with each position of each element of the DMS resonator 500 along the axis 599, with the axis 598 illustrating increasing pitch values (e.g., a greater distance between IDT fingers). The bottom of the graph of FIG. 5D along axis 599 is not associated with a 0 pitch value, but reflects an example of relative pitch values in accordance with some aspects. Details of pitch values and other configurations are provided below. The metallization ratio line 552 shows a relative metallization ration associated with each position of each element of the DMS resonator 500 along the axis 599, with the axis 598 illustrating increasing metallization values (e.g., thicker IDT fingers). The element transition line 561 shows the position between the two IDTs 505A, 505B. The element transition line 561 is associated with a gap between the busbars of the IDTs 505A, 505B, and can be associated with chirp values in the area around the element transition line 561. In other DMS implementations, the characteristics around the element transition line 561 (e.g., and the interface region 521 around the element transition line 561) lead to a cavity mode resonance, which is the mode 3 of FIG. 5B. The mode 3 is associated with an excitation of spurious modes and spurious responses in the passband. However, a DMS as described herein with a relative finger pitch as illustrated in FIG. 5D, particularly around the element transition line 561 reduces or limits any mode formed between adjacent IDTs within the structure (e.g., the mode 3 of FIG. 5B) having a resonance within the passband of the overall filter. Aspects described herein with characteristics described by table 1 limit the mode formed between adjacent IDTs (e.g., the mode 3 of FIG. 5B). In DMS resonators with more than two IDTs, an element transition similar to the element transition line 561 will be present for each pair of adjacent IDTs. The element transitions 562 and 563 are the transitions between the endmost IDTs and the adjacent reflectors (e.g., associated with a busbar gap between the elements).

Table 1 below provides configuration details for some aspects of the DMS resonator 500 configured for near synchronous operation, compared with configuration details for conventional DMS resonators.

TABLE 1

|  | Near Synchronous DMS | DMS |
| --- | --- | --- |
| NfiW | 7-15 | 15-51 |
| dFPeW | Less than 3% in absolute value. | 10%-20% (negative variation). |
| dEta | Less than 15% in absolute value. | Approximately Zero (0) |
| PRIR | 1.05-1.15 | 0.99-1.06 |
| NFL | Less than 3 | 3-7 |

In table 1, NFiW is a number of fingers attached to the busbar of a given IDT. The Nfi 582 of FIG. 5D illustrates the area in the IDT 505A where an associated number of fingers will be present. For example, as described above, an individual IDT of a DMS resonator will have separate busbars that allow isolated electrical inputs and outputs. The Nfi 582 is the number of fingers for the associated IDT 505A (e.g., attached to the busbars of the IDT 505A). The Nfi 582 includes fingers in the central region and transition region for the IDT 505A. Other IDTs will have separate Nfi values, along a width (e.g., long dimension of the corresponding busbars) for each IDTs.

The finger pitch line 551 shows the change in chirp (e.g., finger frequency) along the IDT 505A associated with those fingers. Similarly, NFR refers to a number of fingers around the element transition line 561 where a gap between busbars of the IDT 505A and the IDT 505B occurs. NFR 584 is associated with the number of fingers around the element transition line 561, which further configures the interface region 521 between the adjacent IDTs. The delta FPeW value, shown as dFPeW 585 in the chart of FIG. 5D, is the chirp variation or difference in finger frequency around the element transition line 561, which is associated with the NFR 584 value (e.g., a number of fingers around the element transition line 561). The delta ETA value is a variation in the metallization ratio around the element transition line 561 between the IDTs. The PRIR, shown as PRIR 580 in the chart, is a measure of the maximum finger period variation between a reflector and an adjacent IDT.

As illustrated in table 1, some aspects in accordance with near synchronous DMS configurations include 0, 1, or 2 fingers (e.g., NFR less than or equal to 2) in an NFR region around the element transition line 561 between two IDTs (e.g., the transition region 529 as illustrated in FIG. 5A). In some alternate aspects, additional fingers can be present in the NFR transition region depending on the other configurations allowing additional fingers without a significant acoustic cavity being created at the element transition between adjacent IDTs. For example, as described below, some aspects can have up to 5 fingers in the NFR region. The transition can be chirped in a linear fashion as illustrated, such that the distance between each finger changes in a linear fashion around the element transition line 561. This results in a constant rate of change (e.g., dFPeW) in pitch for each pair of fingers, and the change across the element transition area and the associated dFPeW 585 for the whole region (e.g., the average chirp for the whole area is approximately the same as the chirp between each pair of electrode fingers of the NFR 584 in the region around the element transition line 561). In other aspects, other chirp configurations can be used. Some such aspects operate with a chirp (e.g., variation in finger periodicity) of less than 2% around the transition line 561 between IDTs, and a variation in metallization ratio around the IDT transition that is greater than 0 and up to 10% (e.g., absolute value, variations of metallization ratio can be negative so long as the manufacturing capabilities can achieve the variation, so variations in metallization ratio can be up to +/−10%). The change in the metallization ration around the transition line 561 of up to 10% (e.g., associated with the NFR 584), allows adjustment of the frequency resonance and can be used to adjust the frequency resonance, and to enlarge or reduce the bandwidth of the filter (e.g., to reduce the bandwidth if too much coupling occurs,). Some aspects operate with between 7 and 15 fingers for a given IDT (e.g., the Nfi 582).

The particular implementation reflected in FIG. 5D does not reflect any limitations in the relative design of a DMS resonator configured for near synchronous operation. For example, in different implementations, the relative pitch of fingers within a given IDT can be higher or lower in any position within the DMS resonator, so long as the design limits the acoustic cavity resonance at positions between DMS resonator elements (e.g., between adjacent IDTs). In some aspects, for example, a DMS resonator designed for near synchronous operation is configured to have an electroacoustic cavity resonance below a threshold value that meets implementation performance criteria. The configurations detailed in table 1 describe possible implementations of such near synchronous DMS resonators. Other implementations are possible within the scope of the described aspects. Additionally, as DMS resonators are scaled for different frequency bands, such configuration criteria can be scaled based on the frequencies associated with the target bands for a given DMS resonator.

In particular, conventional DMS resonators are often designed with a chirp between IDTs where the finger pitch around the element transition is up to 20% lower than the finger pitch in other, central parts (e.g., portions not near an element transition) of the IDTs.

TABLE 2

|  | Near Synchronous DMS |
| --- | --- |
| NfiW | 7-15 |
| dFPeW | Greater than 0% Less than 3% |
| dEta | Less than 15% |
| PRIR | 1.05-1.15 |
| NFL | Less than 6 |

Table 2 illustrates configuration details for additional possible implementations of a near synchronous DMS in accordance with aspects described herein. In particular, table 2 describes slight variations in the number of electrode fingers that can be slightly chirped in a transition region between IDTs, while limiting an acoustic resonance between IDTs in a DMS in accordance with near synchronous operation as described herein.

Figure 6:
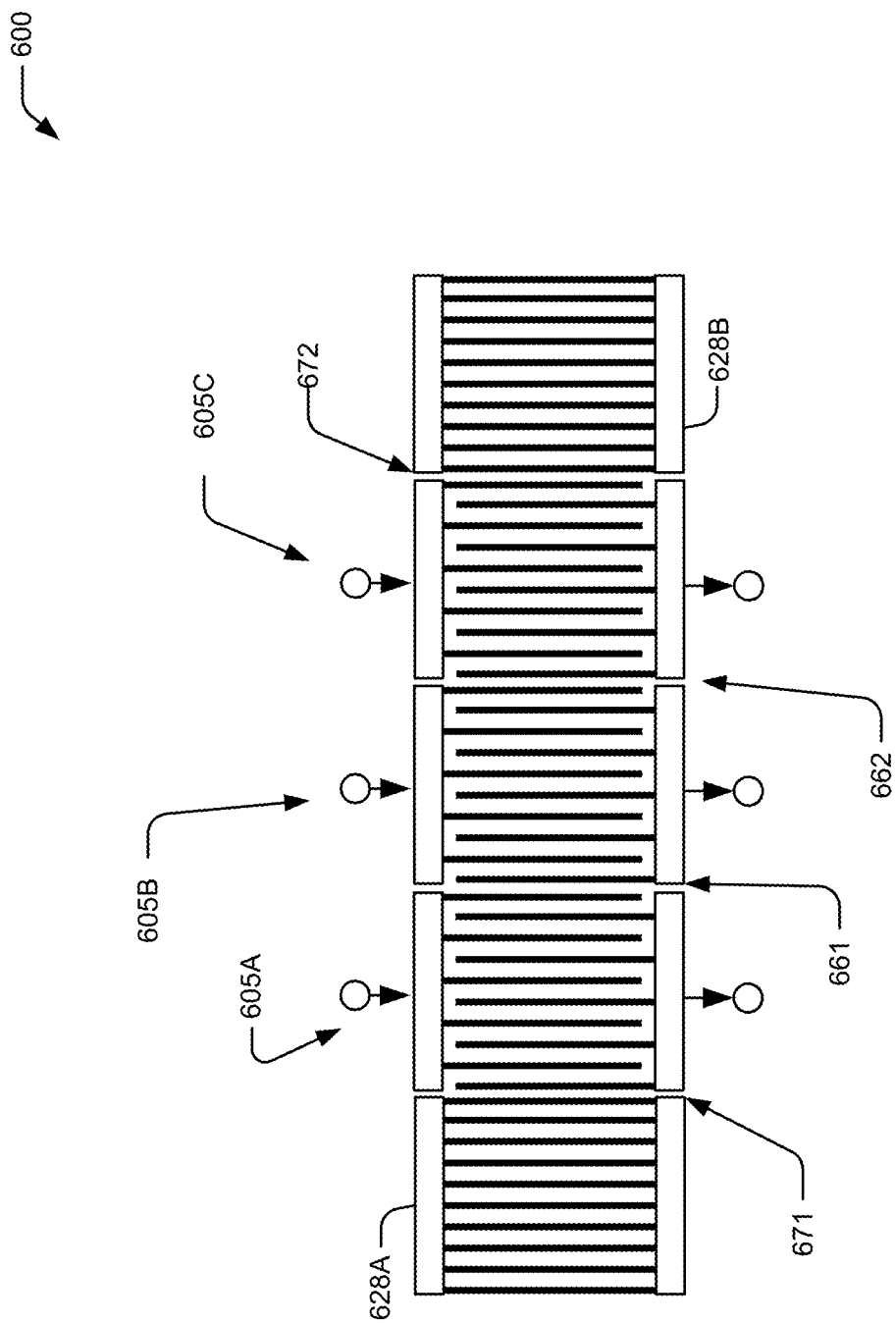
FIG. 6 is a diagram of a DMS resonator with two reflectors and three electroacoustic transducers in accordance with some aspects described herein.

FIG. 6 is a diagram of a DMS resonator 600 with two reflectors 628A, 628B and three IDTs 605A, 605B, 605C in accordance with some aspects described herein. The DMS resonator 600 can be configured for near synchronous operation and to limit cavity resonance (e.g., similar to the resonance from the cavity resonance mode 3 of the interface region 521 illustrated in FIG. 5B) using configurations similar to the configurations detailed above for table 1 and FIG. 5D. For such configurations, any value of table 1 can be used for any of the IDTs 605A, 605B, 605C, reflectors 628A, 628B, and the transition areas 671, 672 between reflectors 628A, 628B and end IDTs, as well as for the transitions 661, 662 between adjacent IDTs.

FIG. 7 is a diagram of a DMS resonator 700 with two reflectors 728A, 728B and an arbitrary number (N) of IDTs 705A and 705B through 705N in accordance with some aspects described herein. Additionally, as shown, the DMS resonator 700 includes two transitions between the reflectors 728A, 728B and the end IDTs, as well as transitions 761A through 761(N−1) (e.g., as the number of transitions (N−1) between adjacent IDTs is one less than the number of IDTs N). Just as described above for the DMS resonators 600 and 500, the DMS resonator 700 can be configured for near synchronous operation and to limit cavity resonance (e.g., from the interface region 521) using configurations similar to the configurations detailed above for table 1 and FIG. 5D. For such configurations, any value of table 1 can be used for any of the IDTs 705A-N, reflectors 728A, 728B, the transition areas 771, 772 between reflectors 728A, 728B and end IDTs, as well as for the transitions 761A through 761(N−1) between adjacent IDTs. Such a configuration can be used in DMS resonators with any number of IDTs, including DMS resonators with three or more IDTS. In some aspects, 15 IDTs is a maximum number of IDTs for a given DMS resonator configuration. Additionally, such IDTs within a single DMS resonator can include variations of any such values. For example, a first IDT may have 15 fingers, and a second IDT may have 7 fingers within a single DMS resonator. Similarly, chirp, metallization values, and other such values can vary from IDT to IDT, and for transitions between different pairs of IDTs, within a single DMS resonator, in accordance with aspects described herein.

Figure 8A:
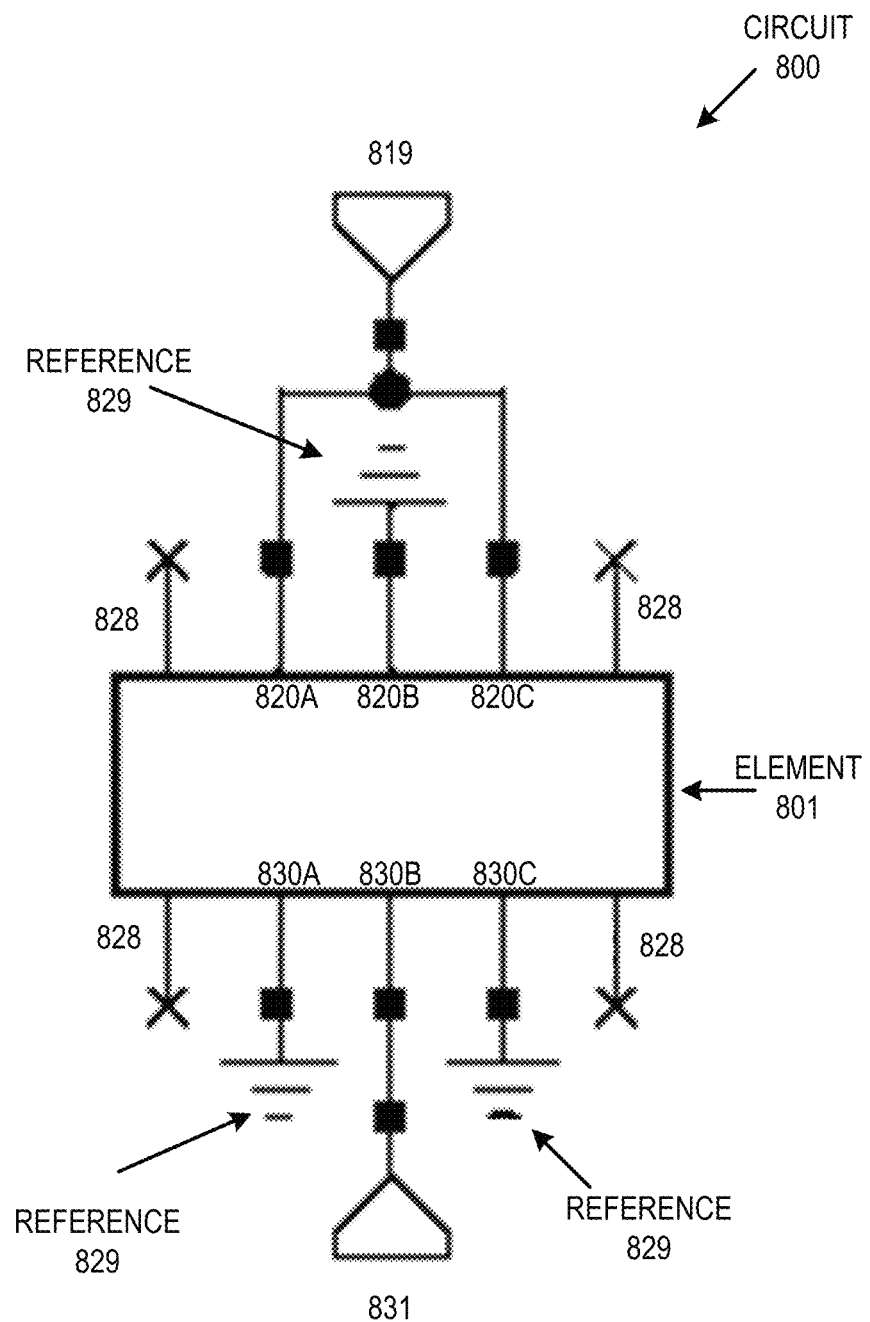
FIG. 8A illustrates an example DMS resonator structure in accordance with aspects described herein.

FIG. 8A illustrates a circuit 800 with a DMS resonator element 801 in accordance with aspects described herein. FIG. 8A illustrates node connections 828, 820A-C, and 830A-C for the DMS resonator element 801. FIG. 8A illustrates reference nodes 829 (e.g., ground connections) coupled to various nodes of the DMS resonator element 801. Inside the DMS resonator element 801 is a DMS resonator similar to the DMS resonator with 3 IDTs of FIG. 6. Node connections 820A and 830A would correspond to the electrical connections of the IDT 605A, node connections 820B and 830B would correspond to the electrical connections of the IDT 605B, and node connections 820C and 830C would correspond to the electrical connections of the IDT 605C, coupled from the busbars of each corresponding IDT to a node in the DMS resonator element 801.

In the illustrated circuitry 800, an input node 819 is connected to node connections 820A and 820C. The node connections 820B, 830A, and 830C are connected to the reference node 829 (e.g., a ground). The node connection 830B is connected to an output node 831. The node connections 828 are open, and not connected internally or externally. The circuitry 800 can be included in a device as a filter, as a resonator within a larger filter as described below, or within any other such device. In some aspects, the DMS resonator element 801 has an associated size (e.g., layout footprint) of approximately 0.07 square millimeters (mm$^2$).

Figure 8B:
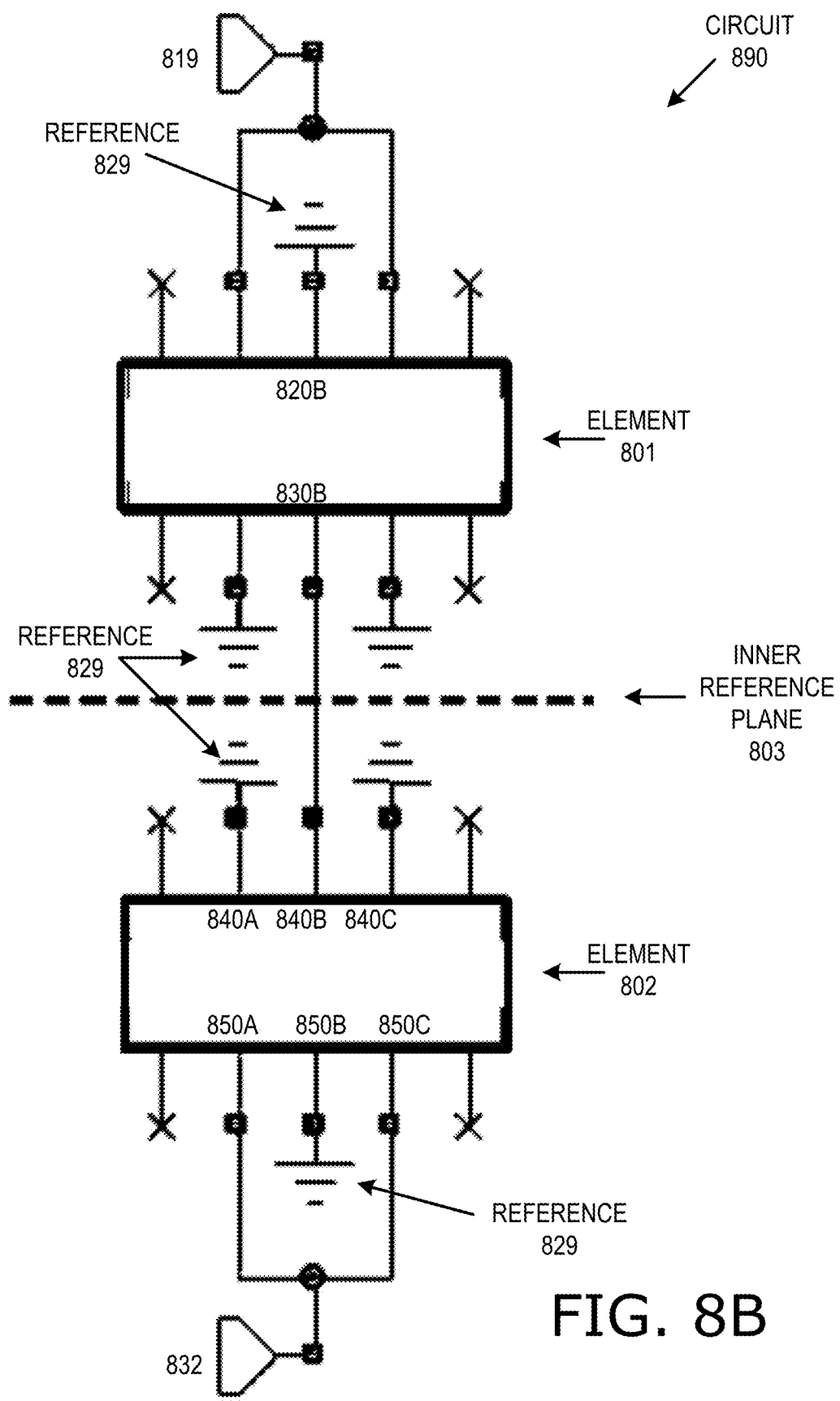
FIG. 8B illustrates an example of two DMS resonator structures in an image-impedance configuration in accordance with aspects described herein.

FIG. 8B illustrates an example circuit 890 of two DMS resonator elements 801, 802 in an image-impedance configuration in accordance with aspects described herein. The layout of the DMS resonator element 801 above the inner reference plane 803 is identical to the layout of circuit 800 in FIG. 8A. Rather than connected to the output node 831, however, the node connection 830B is connected to node connection 840B of the DMS resonator element 802. Node connections 840A, 840C, and 850B are connected to the reference node 829. Node connections 850A, 850C are connected to an output node 832.

In the circuitry 890, since the two DMS resonator elements 801, 802 are similar (e.g., identical within normal manufacturing variances), the conductance and susceptance values of the DMS resonator elements 801, 802 are equal or near equal. Across the inner reference plane 803 connection between the node connection 830B and 840B, there is a maximum power transfer with susceptance is near zero. This is referred to as image-impedance connection operation, and can allow designs with efficient use of two DMS resonators in accordance with aspects described herein to be used for a frequency band filter, particularly when compared to mismatches where susceptance is much larger than conductance, and a mismatch occurs which increases the out of passband attenuation level.

In some aspects, rather than the two DMS resonator elements 801, 802 being the same device, different devices can be used for the DMS resonator elements 801, 802, with the impedances matched to achieve the maximum power transfer described above. Such a configuration can allow configuration of a frequency band filter with additional design configurations where the DMS resonators of the DMS resonator elements 801, 802 have different characteristics, so long as the impedance matching is sufficient to meet design criteria for a particular implementation.

Additionally, as detailed above, even with the use of multiple DMS resonator structures, layout benefits for a device can be present when compared with a single conventional DMS resonator. In some aspects, the two DMS resonator structures and connecting circuitry uses a surface area on a chip or substrate that is approximately 0.17 mm$^2$ within a wireless apparatus (e.g., a filter, a transceiver, etc. as describe in FIGS. 10-12), which can be comparable to the design footprint of a single conventional DMS resonator. The presence of two separate elements (e.g., the DMS resonator elements 801,802) provides design flexibility even when associated with a similar footprint, as placement of the two separate elements with a similar layout footprint provides layout flexibility when compared with a single (e.g., unadjustable) element with fixed dimensions.

Figure 8C:
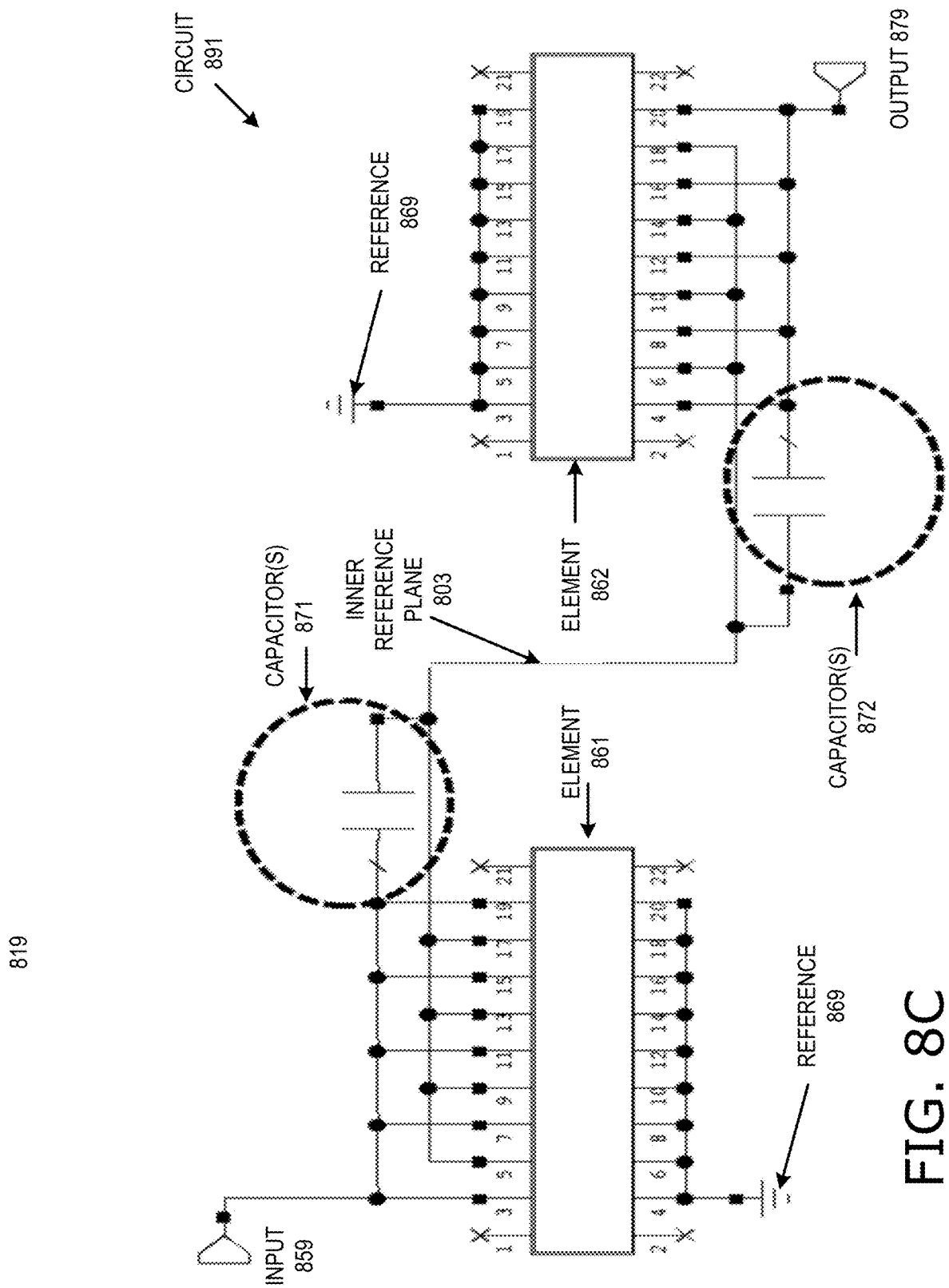
FIG. 8C illustrates an example of two DMS resonator structures in an image-impedance configuration with a shunt capacitance for image tuning in accordance with aspects described herein.

FIG. 8C illustrates an example circuitry 891 with two DMS resonator elements 861, 862 between an input 859 and an output 879 in an image-impedance configuration with shunt capacitors 871, 872 for image tuning in accordance with aspects described herein. The DMS resonator elements

861, 862 are connected by an electrical connection across the inner reference plane 803 as part of the image-impedance configuration.

The circuit of FIG. 8C illustrates connection nodes 861-1 through 861-22 of the DMS element 861 and connection nodes 862-1 through 862-22 for the DMS element 862. Similar to the description of the DMS element 801 above, each of the DMS elements 861 and 862 include open end node connections, and pairs of node connections for each IDT (e.g., connection nodes 861-3 and 861-4 for a first IDT, etc.). As illustrated, the DMS resonator elements 861, 862 are connected in the circuit 891 with signal connections on one side and reference node 869 (e.g., ground) connections on the other side of the element. The connections of the circuit 891 result in all input/output nodes on one side of the element, and ground connections for each IDT on the opposite side of the element. In other aspects, the inputs can be on one side, and the outputs on the other side, with the ground connections for IDTs connected to the output on the same side as the input connections, and ground connections for IDTs connected to the output on the same side as the output connections. In other aspects, other configurations can be applied for circuitry in which a DMS resonator with configurations for near synchronous operation are described.

The shunt capacitors 871, 872 are connected between the input signal paths and the output signal paths for each element track. The capacitors 871, 872 allow individual tuning of the antiresonance frequency of the mode 2 of each element track. The tuning from the capacitors 871, 872 can be used for frequency band tuning through adjustment of an image mode and frequency position and impedance. Such tuning can also allow adjustments to a steepness of a filter right skirt and a filter attenuation level. In some aspects, capacitors 871, 872 can be selected (e.g., configured during device design) as static capacitors with capacitance values between 0 (e.g., with no capacitor in a signal path) and 1 picofarad (pF). In some aspects, such a configuration can be selected with a constraint of 0.2 pF steps. Such capacitors 871, 872 can further provide a benefit of design flexibility with fine tuning of the DMS resonator in a filter.

Figure 8D:
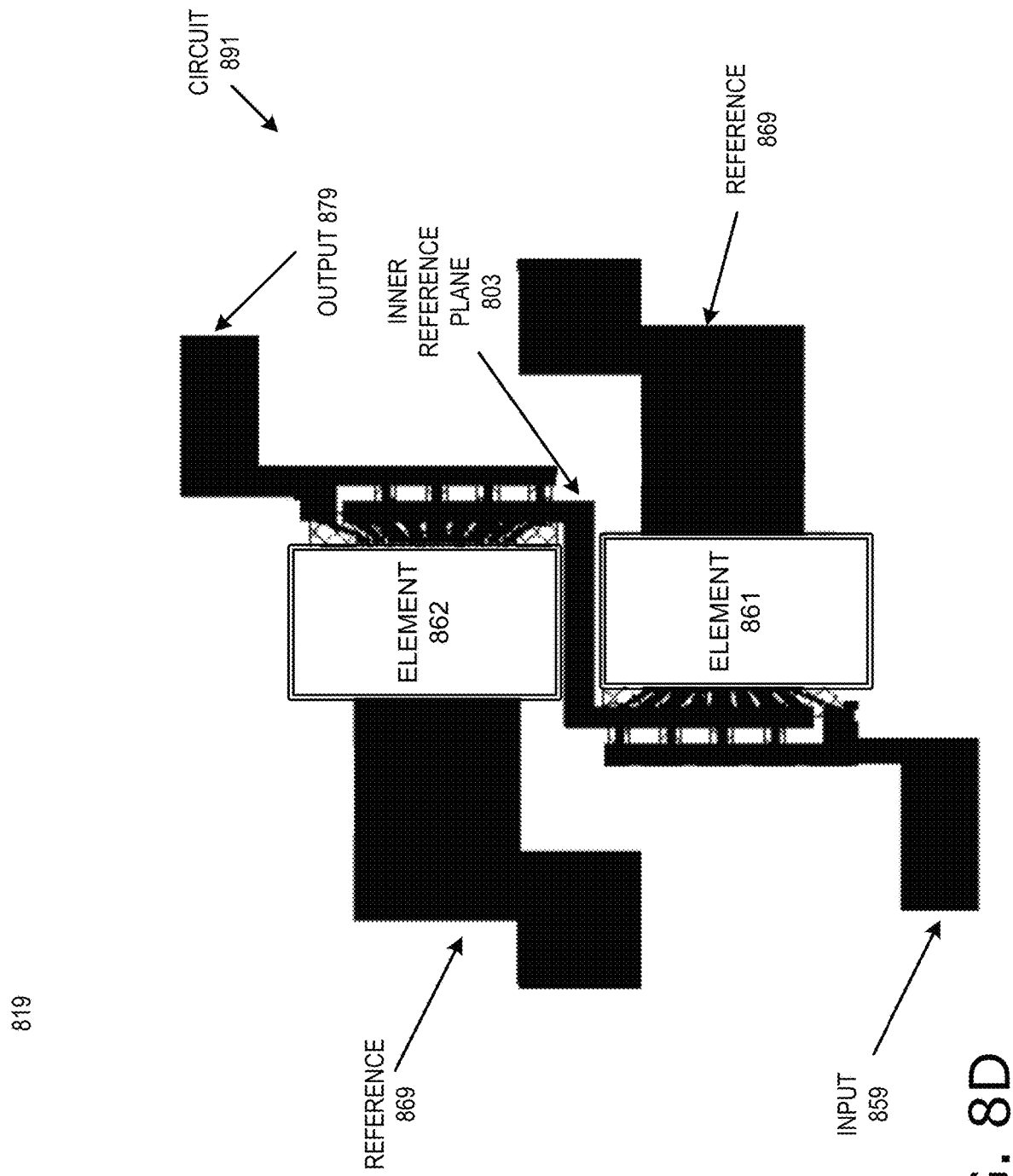
FIG. 8D illustrates an example circuit layout of two DMS resonator structures in an image-impedance configuration in accordance with some aspects.

FIG. 8D is an example layout diagram of the circuit 891 in accordance with some aspects. FIG. 8D includes the element 861 and the element 861 illustrated in a circuit layout, with illustrated electrical connections showing a surface area of an integrated circuit design or substrate surface area taken by the DMS resonator elements 861, 862. As shown, the input 859 follows a conductive path to the a first set of input nodes on a left side of the DMS resonator element 861. An electrical path across the inner reference plane 803 connects a second set of output nodes on the left side of the DMS resonator element 861 to a third set of input nodes on the right side of the element 862. A fourth set of output nodes on the right side of the element 862 connect to the output 879. A left side of the element 862 and a right side of the element 861 are coupled to a reference node 869 (e.g., ground). As discussed above, though the DMS resonator elements 861, 862 are shown in a particular relative positioning, in other design layouts, the elements could be positioned in any relative space near each other, providing design flexibility, so long as the electrical connections provide sufficient performance to meet device operating limits. Similarly, while the inputs and outputs are illustrated on a shared same side in FIG. 8D, with a ground on an opposite side, in other aspects, the inputs and outputs can be on opposite sides of a DMS resonator element, with the respective input and output nodes on each sides between adjacent ground nodes, in other aspects.

TABLE 3

| B71 DMS filter | DMS 1 | DMS 2 |
|---|---|---|
| Number of IDTs | 9 | 9 |
| NfiW | 7-7-11-7-11-7-11-7-7 | 9-9-13-9-13-9-13-9-9 |
| dFPew | 2.9% | 1.7% |
| dEta | 11.8% | 12.9% |
| PRIR | 1.15 | 1.15 |
| NFL | 2 | 2 |

Table 3 illustrates an example design configuration for the circuitry 891 in accordance with one aspect. The design configuration of table 3 can, for example, be used for a band 71 filter in a cellular communication system of a wireless communication apparatus in accordance with some aspects. The example filter includes 9 IDTs for a first DMS resonator element (e.g., DMS 1 similar to the DMS resonator element 861) and 9 IDTs for a second DMS resonator element (e.g., DMS 2 similar to the DMS resonator element 862). The first DMS resonator elements has, consecutively, 7, 7, 11, 7, 11, 7, 11, 7, 7 fingers for the IDTs of the first DMS resonator. The second DMS resonator has a different IDT configuration, with IDTs having a respective number of fingers as indicated in Table 2. The characteristics of each IDT is described by the additional rows of table 2 in accordance with the description in table 1 above related to chirp, transition regions metallization ratios, etc.

In some aspects, DMS resonators can be configured or designed such that electroacoustic cavity resonance around the first interface region between the first IDT and the second IDT is below a threshold value to limit localized energy in the transition region. In some such aspects, such a threshold can be set to limit localized energy in the transition region and to allow a sustained power level in the apparatus of 24 decibels (dBm) or greater.

In other aspects, such DMS resonators can be configured or designed such that a level of self-harmonic generated power in the apparatus (e.g., the localized energy in the modes of a DMS resonator) is comparable to a level of self-harmonic generated power of a pure ladder section using a same stack with comparable insertion loss and attenuation performance.

Figure 8E:
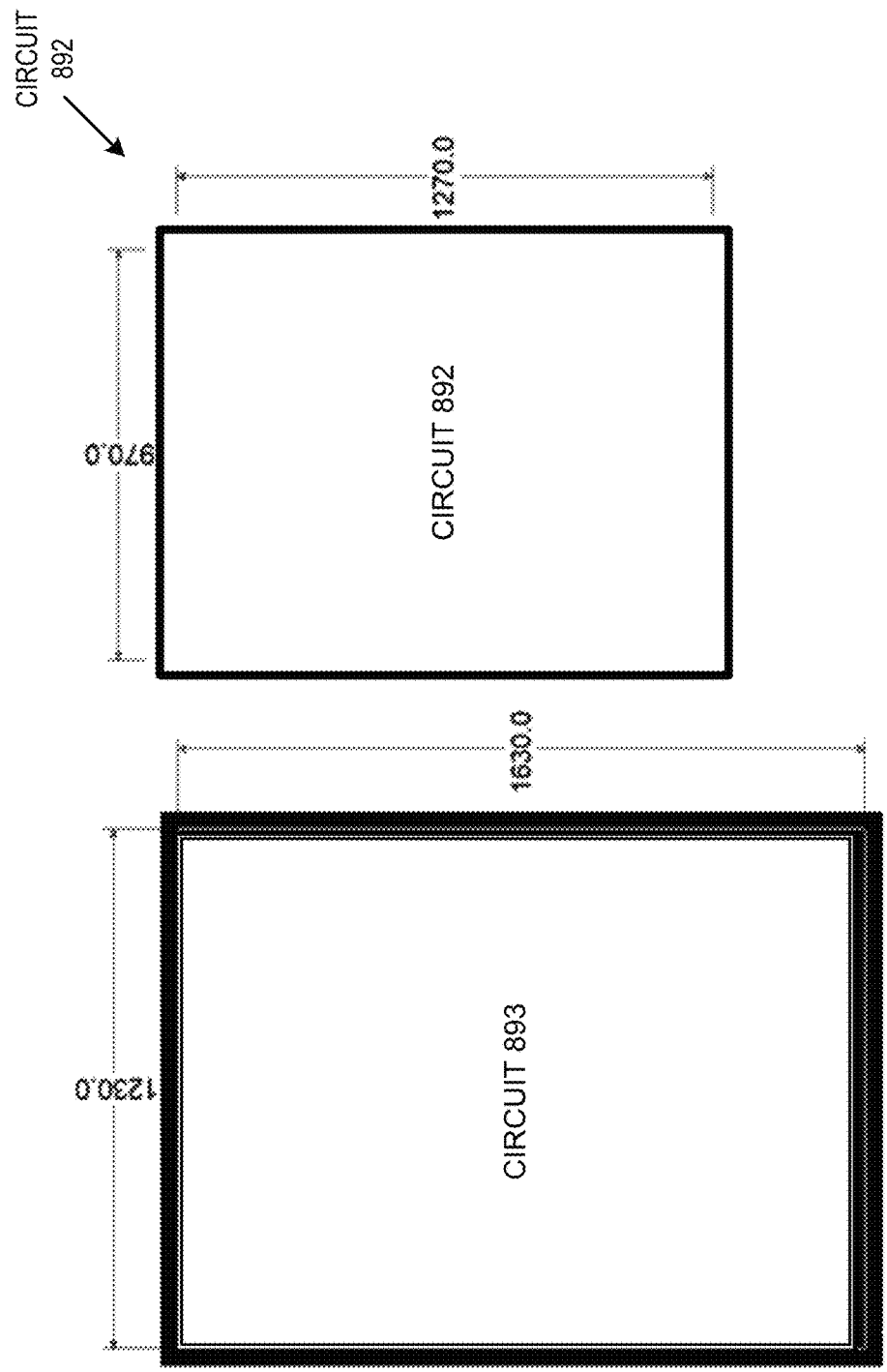
FIG. 8E provides a comparison between an example physical layout of a non-DMS filter and a similar DMS filter in accordance with aspects described herein.

FIG. 8E provides a comparison between an example physical layout of a non-DMS filter circuit 893 and a similar DMS filter 892 in accordance with aspects described herein. The filter circuits 892, 893 are shown with dimensions illustrating that the similar (e.g., providing similar performance to meet device operating limits) DMS filter 892 takes almost 40% less area on the surface of a substrate.

Figure 10:
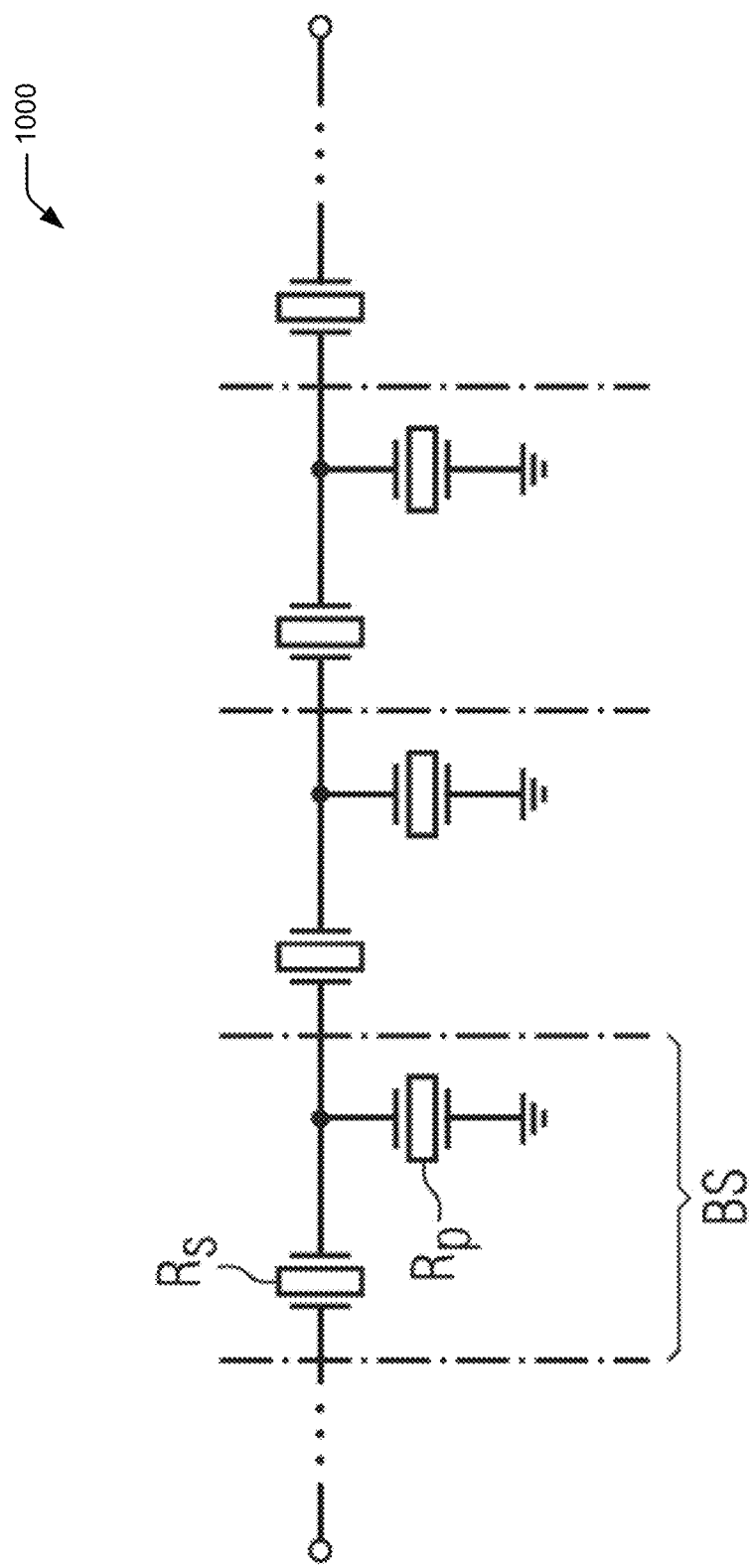
FIG. 10 is a schematic representation of an example filter that may employ the disclosed electroacoustic device, in accordance with examples described herein.

As described herein, a near synchronous DMS resonator can be used in a filter such as the filter 1000 of FIG. 10, with the use of near synchronous DMS resonators able to provide similar performance with fewer ladder steps (e.g., with two resonators Rs and Rp per ladder step or ladder section as illustrated in FIG. 10). In some aspects, a DMS resonator can be configured such that the power in a DMS resonator is comparable to the power in a ladder section of non-DMS resonators, with comparable insertion loss and attenuation performance. For example, in some aspects, a Duplexer with non-DMS resonators can be redesigned with DMS resonators to reduce the filter footprint (e.g., die size) by approximately 40% while providing comparable or improved performance. In some aspects, such a DMS filter 892 can be used both in a receive (Rx) path and a transmit (Tx) path of a wireless communication device, significantly reducing the size of the chip used to implement the filter circuit in each path.

Figure 9:
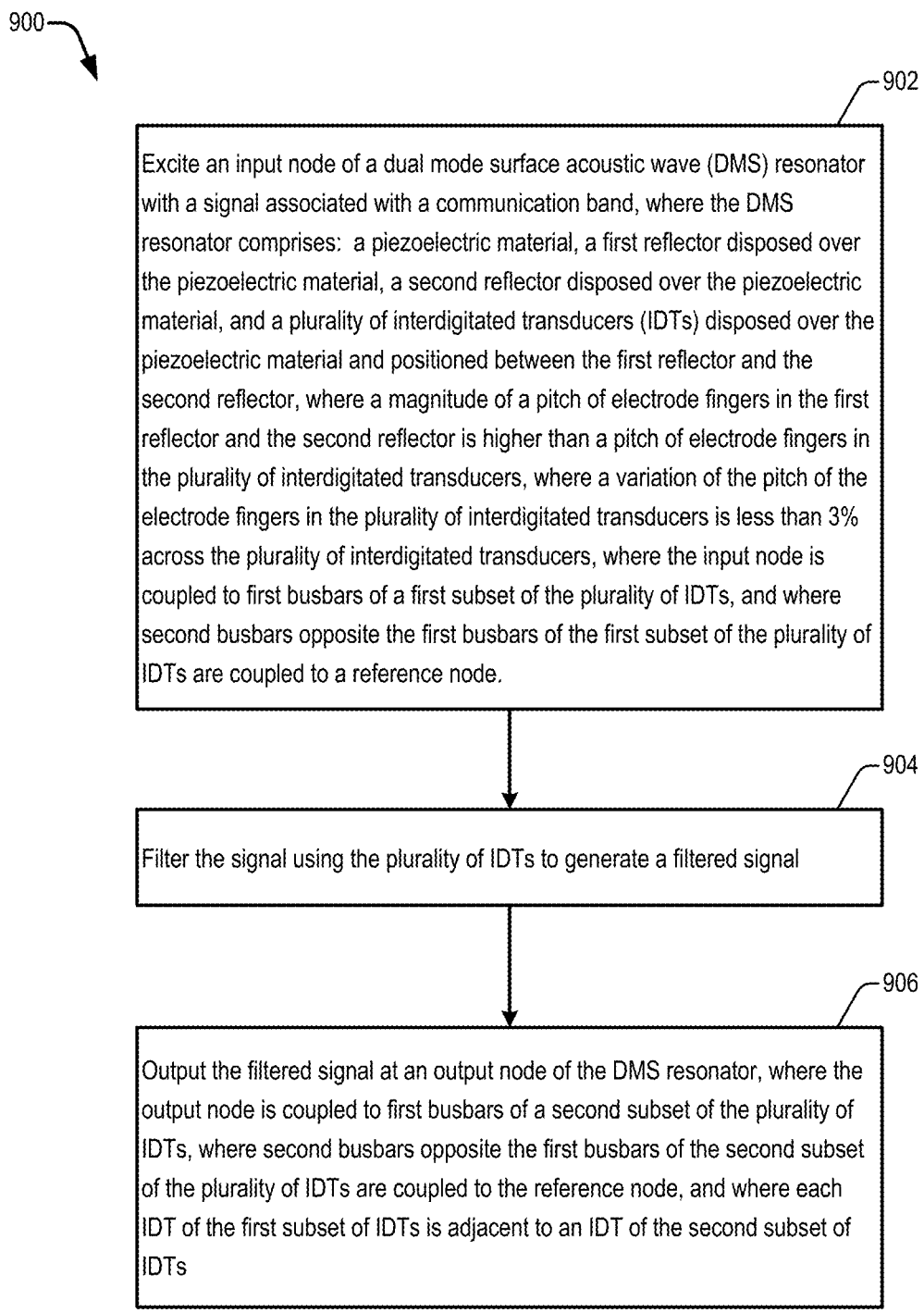
FIG. 9 is a flowchart illustrating a method of operation of the disclosed electroacoustic device, in accordance with examples described herein.

FIG. 9 is a flow diagram illustrating an example method 900 performed by a DMS resonator configured for near synchronous operation in accordance with aspects described herein. The method 900 is described in the form of a set of blocks that specify operations that can be performed. However, operations are not necessarily limited to the order shown in FIG. 9 or described herein, for the operations may be implemented in alternative orders or in fully or partially overlapping manners. Also, more, fewer, and/or different operations may be implemented to perform the method 900, or an alternative process. In some aspects, the method 900 can be performed by a device comprising circuitry configured for operations of the method 900. In some aspects, control circuitry or one or more processors of the device can be configured to perform the operations. In some aspects, the method 900 can be implemented as instructions in a non-transitory computer readable storage medium that, when executed by one or more processors of the device, cause the device to perform operations of the method 900.

At block 902, the method includes exciting an input node of a dual mode surface acoustic wave (DMS) resonator with a signal associated with a communication band, where the DMS resonator comprises: a piezoelectric material, a first reflector disposed over the piezoelectric material, a second reflector disposed over the piezoelectric material, and a plurality of interdigitated transducers (IDTs) disposed over the piezoelectric material and positioned between the first reflector and the second reflector, where a magnitude of a pitch of electrode fingers in the first reflector and the second reflector is higher than a pitch of electrode fingers in the plurality of interdigitated transducers, where a variation of the pitch of the electrode fingers in the plurality of interdigitated transducers is less than 3% across the plurality of interdigitated transducers, where the input node is coupled to first busbars of a first subset of the plurality of IDTs, and where second busbars opposite the first busbars of the first subset of the plurality of IDTs are coupled to a reference node.

At block 904, the method includes filtering the signal using the plurality of IDTs to generate a filtered signal.

At block 906, the method includes outputting the filtered signal at an output node of the DMS resonator, where the output node is coupled to first busbars of a second subset of the plurality of IDTs, where second busbars opposite the first busbars of the second subset of the plurality of IDTs are coupled to the reference node, and where each IDT of the first subset of IDTs is adjacent to an IDT of the second subset of IDTs.

As described above, conventional DMS resonators are highly asynchronous, which can cause strong spurious peaks in a passband range for a filter designed using the conventional DMS resonator. Aspects described herein reduce or eliminate acoustic cavity resonances that occur between IDTs of conventional DMS resonators using the design configurations described above, while maintaining the benefits of the cascaded IDTs of DMS resonator topology, which enable multiple transversal electrical modes (e.g., compared with non-DMS single IDT SAW resonators).

Aspects described herein improve the operation of DMS resonators and devices that use SAW resonators through improved suppression of spurious (e.g., parasitic) modes, improved manufacturability associated with $SiO_2$ gap filling limitations (e.g., enabling some frequency bands without finger pitches that cause $SiO_2$ gap filling issues with manufacturability), and a reduced size when compared with conventional DMS designs. In particular, a size benefit is possible due to the difficulty of using high coupling substrates with conventional DMS resonators, where near synchronous DMS resonators in accordance with aspects described herein can use high coupling substrates which allows a smaller size and, for example, removal of at least one ladder stage (e.g., as described in FIG. 10) in device designs. Additionally, in some aspects, the low (e.g., constant or near constant) pitch variation allows improved linearity over power variations when compared with conventional DMS resonators, which have poor power/linearity performance due to the asynchronous structure with the low pitch (e.g., closely spaced fingers) in the IDT transition regions between adjacent IDTs. Aspects described herein may include potential trade-offs associated with a slightly lower maximum achievable bandwidth, higher impedance for designs with fewer IDTs per resonator, and slightly higher insertion loss, which can be compensated for as part of device design.

FIG. 10 is a schematic representation of an example filter 1000 that may employ a DMS resonator configured for near synchronous operation, in accordance with aspects described herein. In particular, the filter 1000 comprises a ladder-type arrangement of acoustic SAW resonators Rs, Rp (where Rs are series resonators and Rp are parallel resonators). A DMS resonator configured for near synchronous operation may be employed for at least one of the acoustic SAW resonators Rs, Rp of the filter 1000.

The ladder-type structure of the filter 1000 comprises a plurality of basic sections. Each basic section comprises at least one series resonator Rs and at least one parallel resonator Rp. The basic sections may be connected together in series in a number of basic sections that is necessary to achieve a desired selectivity. Series resonators Rs that belong to neighbored basic sections may be combined to a common series resonator Rs, and parallel resonators Rp may also be combined if they are directly neighbored and belonging to different basic sections. One basic section provides a basic filter. More basic sections can be added to provide for sufficient selectivity associated with a particular resonator used in the section.

Figure 11:
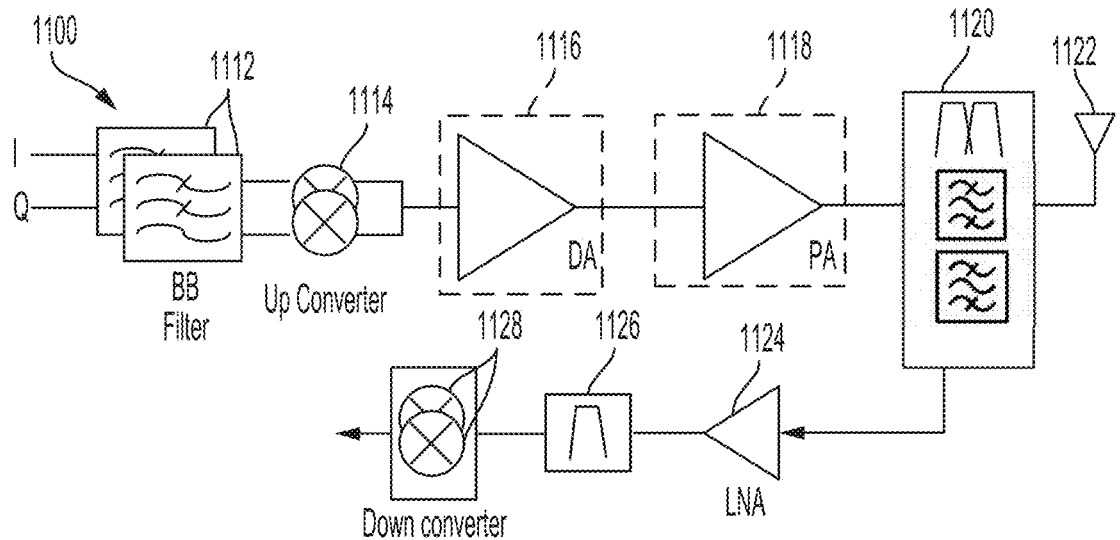
FIG. 11 is a functional block diagram of at least a portion of an example of a simplified wireless transceiver circuit in which the disclosed electroacoustic device described herein may be employed, in accordance with examples described herein.

FIG. 11 is a functional block diagram of at least a portion of an example of a simplified wireless transceiver circuit 1100 in which a DMS resonator configured for near synchronous operation as described herein may be employed. The transceiver circuit 1100 is configured to receive signals/information for transmission (shown as I and Q values) which is provided to one or more base band filters 1112. The filtered output is provided to one or more mixers 1114. The output from the one or more mixers 1114 is provided to a driver amplifier 1116 whose output is provided to a power amplifier 1118 to produce an amplified signal for transmission. The amplified signal is output to the antenna 1122 through one or more filters 1120 (e.g., duplexers if used as a frequency division duplex transceiver or other filters). The one or more filters 1120 may include the disclosed DMS resonator. The antenna 1122 may be used for both wirelessly transmitting and receiving data. The transceiver circuit 1100 includes a receive path through the one or more filters 1120 to be provided to a low noise amplifier (LNA) 1124 and a further filter 1126 and then down-converted from the receive frequency to a baseband frequency through one or more mixer circuits 1128 before the signal is further processed (e.g., provided to an analog digital converter and then demodulated or otherwise processed in the digital domain). There may be separate filters for the receive circuit (e.g., may have a separate antenna or have separate receive filters) that may be implemented using the disclosed DMS resonator.

Figure 12:
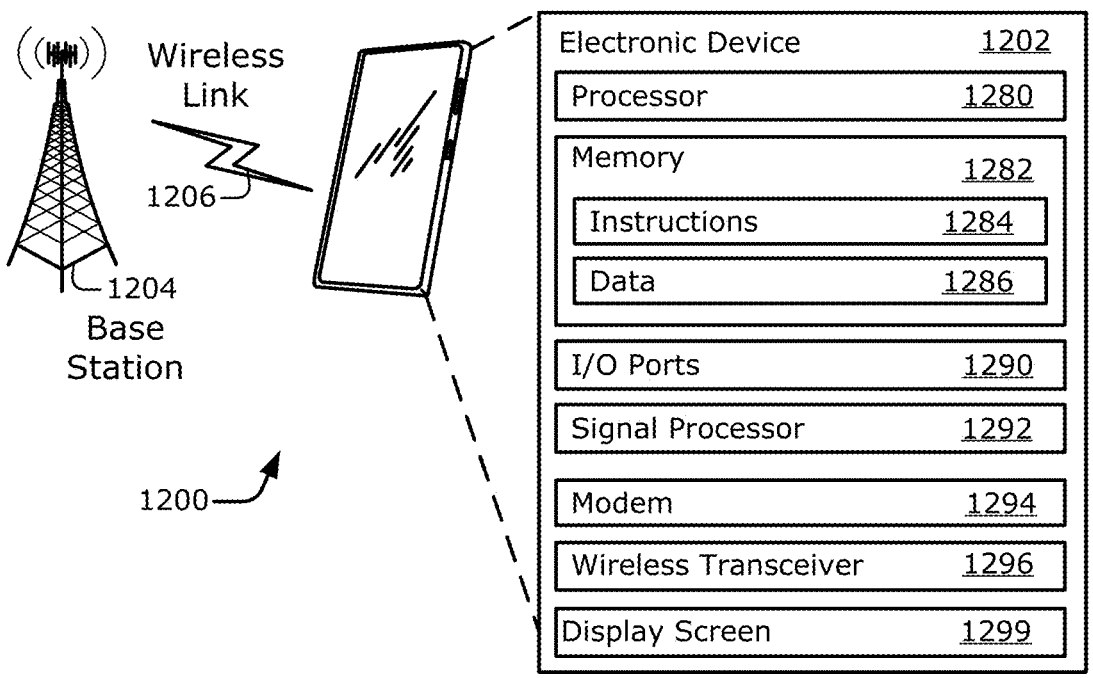
FIG. 12 is a diagram of an environment that includes an electronic device that includes a wireless transceiver, such as the transceiver circuit of FIG. 11, in accordance with examples described herein.

FIG. 12 is a diagram of an environment 1200 that includes an electronic device 1202 that includes a wireless transceiver circuit 1296, such as the transceiver circuit 1100 of FIG. 11. In some aspects, the electronic device 1202 includes a display screen 1299 that can be used to display information associated with data transmitted via wireless link 1206 and processed using components of electronic device 1202 described below. Other aspects of an electronic device in accordance with aspects described herein using a low phase delay filter for multi-band communication can be configured without a display screen. In the environment 1200, the electronic device 1202 communicates with a base station 1204 through a wireless link 1206. As shown, the electronic device 1202 is depicted as a smart phone. However, the electronic device 1202 may be implemented as any suitable computing or other electronic device, such as a cellular base station, broadband router, access point, cellular or mobile phone, gaming device, navigation device, media device, laptop computer, desktop computer, tablet computer, server computer, network-attached storage (NAS) device, smart appliance, an automobile including a vehicle-based communication system, Internet of Things (IoT) device, sensor or security device, asset tracker, and so forth.

The base station 1204 communicates with the electronic device 1202 via the wireless link 1206, which may be implemented as any suitable type of wireless link. Although depicted as a base station tower of a cellular radio network, the base station 1204 may represent or be implemented as another device, such as a satellite, terrestrial broadcast tower, access point, peer to peer device, mesh network node, fiber optic line, another electronic device generally as described above, and so forth. Hence, the electronic device 1202 may communicate with the base station 1204 or another device via a wired connection, a wireless connection, or a combination thereof. The wireless link 1206 can include a downlink of data or control information communicated from the base station 1204 to the electronic device 1202 and an uplink of other data or control information communicated from the electronic device 1202 to the base station 1204. The wireless link 1206 may be implemented using any suitable communication protocol or standard, such as 3rd Generation Partnership Project Long-Term Evolution (3GPP LTE, 3GPP NR 5G), IEEE 802.11, IEEE 802.16, Bluetooth™, and so forth.

The electronic device 1202 includes a processor 1280 and a memory 1282. The memory 1282 may be or form a portion of a computer readable storage medium. The processor 1280 may include any type of processor, such as an application processor or a multi-core processor, that is configured to execute processor-executable instructions (e.g., code) stored by the memory 1282. The memory 1282 may include any suitable type of data storage media, such as volatile memory (e.g., random access memory (RAM)), non-volatile memory (e.g., Flash memory), optical media, magnetic media (e.g., disk or tape), and so forth. In the context of the disclosure, the memory 1282 is implemented to store instructions 1284, data 1286, and other information of the electronic device 1202, and thus when configured as or part of a computer readable storage medium, the memory 1282 does not include transitory propagating signals or carrier waves.

The electronic device 1202 may also include input/output ports 1290. The I/O ports 1290 enable data exchanges or interaction with other devices, networks, or users or between components of the device.

The electronic device 1202 may further include a signal processor (SP) 1292 (e.g., such as a digital signal processor (DSP)). The signal processor 1292 may function similar to the processor and may be capable executing instructions and/or processing information in conjunction with the memory 1282.

For communication purposes, the electronic device 1202 also includes a modem 1294, a wireless transceiver 1296, and an antenna (not shown). The wireless transceiver 1296 provides connectivity to respective networks and other electronic devices connected therewith using radio-frequency (RF) wireless signals and may include the transceiver circuit 1100 of FIG. 11. The wireless transceiver 1296 may facilitate communication over any suitable type of wireless network, such as a wireless local area network (LAN) (WLAN), a peer to peer (P2P) network, a mesh network, a cellular network, a wireless wide area network (WWAN), a navigational network (e.g., the Global Positioning System (GPS) of North America or another Global Navigation Satellite System (GNSS)), and/or a wireless personal area network (WPAN).

The various operations of methods described above may be performed by any suitable means capable of performing the corresponding functions. The means may include various hardware and/or software component(s) and/or module(s), including, but not limited to a circuit, an application-specific integrated circuit (ASIC), or processor.

By way of aspect, an element, or any portion of an element, or any combination of elements described herein may be implemented as a "processing system" that includes one or more processors. Aspects of processors include microprocessors, microcontrollers, graphics processing units (GPUs), central processing units (CPUs), application processors, digital signal processors (DSPs), reduced instruction set computing (RISC) processors, systems on a chip (SoC), baseband processors, field programmable gate arrays (FPGAs), programmable logic devices (PLDs), state machines, gated logic, discrete hardware circuits, and other suitable hardware configured to perform the various functionality described throughout the disclosure. One or more processors in the processing system may execute software. Software shall be construed broadly to mean instructions, instruction sets, code, code segments, program code, programs, subprograms, software components, applications, software applications, software packages, routines, subroutines, objects, executables, threads of execution, procedures, functions, etc., whether referred to as software, firmware, middleware, microcode, hardware description language, or otherwise.

Accordingly, in one or more aspect embodiments, the functions or circuitry blocks described may be implemented in hardware, software, or any combination thereof. If implemented in software, the functions may be stored on or encoded as one or more instructions or code on a computer-readable medium. Computer-readable media includes computer storage media. Storage media may be any available media that can be accessed by a computer. By way of aspect, and not limitation, such computer-readable media can include a random-access memory (RAM), a read-only memory (ROM), an electrically erasable programmable ROM (EEPROM), optical disk storage, magnetic disk storage, other magnetic storage devices, combinations of the aforementioned types of computer-readable media, or any other medium that can be used to store computer executable code in the form of instructions or data structures that can be accessed by a computer. In some aspects, components described with circuitry may be implemented by hardware, software, or any combination thereof.

The phrase "coupled to" and the term "coupled" refers to any component that is physically connected to another component either directly or indirectly, and/or any component that is in communication with another component (e.g., connected to the other component over a wired or wireless connection, and/or other suitable communication interface) either directly or indirectly.

Generally, where there are operations illustrated in figures, those operations may have corresponding counterpart means-plus-function components with similar numbering.

As used herein, the term "determining" encompasses a wide variety of actions. For aspect, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes and variations may be made in the arrangement, operation and details of the methods and apparatus described above without departing from the scope of the claims.

Claim language or other language reciting "at least one of" a set and/or "one or more" of a set indicates that one member of the set or multiple members of the set (in any combination) satisfy the claim. For example, claim language reciting "at least one of A and B" or "at least one of A or B" means A, B, or A and B. In another example, claim language reciting "at least one of A, B, and C" or "at least one of A, B, or C" means A, B, C, or A and B, or A and C, or B and C, A and B and C, or any duplicate information or data (e.g., A and A, B and B, C and C, A and A and B, and so on), or any other ordering, duplication, or combination of A, B, and C. The language "at least one of" a set and/or "one or more" of a set does not limit the set to the items listed in the set. For example, claim language reciting "at least one of A and B" or "at least one of A or B" may mean A, B, or A and B, and may additionally include items not listed in the set of A and B. The phrases "at least one" and "one or more" are used interchangeably herein.

Claim language or other language reciting "at least one processor configured to," "at least one processor being configured to," "one or more processors configured to," "one or more processors being configured to," or the like indicates that one processor or multiple processors (in any combination) can perform the associated operation(s). For example, claim language reciting "at least one processor configured to: X, Y, and Z" means a single processor can be used to perform operations X, Y, and Z; or that multiple processors are each tasked with a certain subset of operations X, Y, and Z such that together the multiple processors perform X, Y, and Z; or that a group of multiple processors work together to perform operations X, Y, and Z. In another example, claim language reciting "at least one processor configured to: X, Y, and Z" can mean that any single processor may only perform at least a subset of operations X, Y, and Z.

Where reference is made to one or more elements performing functions (e.g., steps of a method), one element may perform all functions, or more than one element may collectively perform the functions. When more than one element collectively performs the functions, each function need not be performed by each of those elements (e.g., different functions may be performed by different elements) and/or each function need not be performed in whole by only one element (e.g., different elements may perform different sub-functions of a function). Similarly, where reference is made to one or more elements configured to cause another element (e.g., an apparatus) to perform functions, one element may be configured to cause the other element to perform all functions, or more than one element may collectively be configured to cause the other element to perform the functions.

Where reference is made to an entity (e.g., any entity or device described herein) performing functions or being configured to perform functions (e.g., steps of a method), the entity may be configured to cause one or more elements (individually or collectively) to perform the functions. The one or more components of the entity may include at least one memory, at least one processor, at least one communication interface, another component configured to perform one or more (or all) of the functions, and/or any combination thereof. Where reference to the entity performing functions, the entity may be configured to cause one component to perform all functions, or to cause more than one component to collectively perform the functions. When the entity is configured to cause more than one component to collectively perform the functions, each function need not be performed by each of those components (e.g., different functions may be performed by different components) and/or each function need not be performed in whole by only one component (e.g., different components may perform different sub-functions of a function).

The following is a set of non-limiting aspects in accordance with the details provided herein:

Aspect 1. An apparatus comprising: a dual mode surface acoustic wave (DMS) resonator, comprising: a piezoelectric material; a first interdigital transducer (IDT) disposed over a surface of the piezoelectric material, the first IDT comprising: a first busbar; a second busbar parallel to the first busbar; and a first plurality of IDT electrode fingers comprising first IDT electrode fingers extending from the first busbar toward the second busbar and second IDT electrode fingers extending from the second busbar toward the first busbar in an interdigitated configuration; and a second IDT disposed over the surface of the piezoelectric material adjacent to the first IDT along an interface region between the first IDT and the second IDT, the second IDT comprising: a third busbar; a fourth busbar parallel to the third busbar; and a second plurality of IDT electrode fingers comprising third IDT electrode fingers extending from the third busbar toward the fourth busbar and fourth IDT electrode fingers extending from the fourth busbar toward the third busbar in the interdigitated configuration; wherein the first IDT and the second IDT each include a transition region comprising five or fewer electrode fingers nearest the interface region, and wherein a chirp variation in the transition region is not zero, and wherein the chirp variation in the transition region is less than plus or minus three percent.

Aspect 2. The apparatus of Aspect 1, wherein the five or fewer electrode fingers have a transition area metallization ratio lower or greater than a metallization ratio of electrode fingers of the first IDT and the second IDT outside the transition region.

Aspect 3. The apparatus Aspect 2, wherein the transition area metallization ratio is less than fifteen percent lower or greater than the metallization ratio of the electrode fingers outside the transition region.

Aspect 4. The apparatus of any of Aspects 1 to 3, wherein: the first plurality of IDT electrode fingers consists of between 7 and 15 electrode fingers; and the second plurality of IDT electrode fingers consists of between 7 and 15 electrode fingers.

Aspect 5. The apparatus of any of Aspects 1 to 4, wherein an electroacoustic cavity resonance around the first interface region between the first IDT and the second IDT is below a threshold value to limit localized energy in the transition region.

Aspect 6. The apparatus Aspect 5, wherein the threshold value is set to limit localized energy in the transition region and to allow a sustained power level in the apparatus of 24 decibels (dBm) or greater.

Aspect 7. The apparatus of any of Aspects 1 to 6, wherein a level of self-harmonic generated power in the apparatus is comparable to a level of self-harmonic generated power of a pure ladder section using a same stack with comparable insertion loss and attenuation performance.

Aspect 8. The apparatus of any of Aspects 1 to 7, wherein a second mode of the DMS resonator is defined by a distance between the first IDT reflector and the second IDT reflector.

Aspect 9. The apparatus of any of Aspects 1 to 8, further comprising: a first IDT reflector; a second IDT reflector, wherein the first IDT and the second IDT are disposed between the first IDT reflector and the second IDT reflector.

Aspect 10. The apparatus of Aspect 9, wherein a passband of a filter formed by the DMS resonator is substantially formed based on an acoustic wave formed by the second mode between the first IDT reflector and the second IDT reflector.

Aspect 11. The apparatus of any of Aspects 1 to 10, wherein a passband of a filter formed by the DMS resonator is substantially based on an acoustic wave formed by the first mode and the second mode.

Aspect 12. The apparatus of any of Aspects 1 to 11, further comprising a third IDT adjacent to the second IDT on an opposite side from the first IDT.

Aspect 13. The apparatus of any of Aspects 1 to 12, further comprising a plurality of additional IDTs positioned with busbars along shared lines with the busbars of the first IDT and the second IDT, wherein each IDT of the plurality of additional IDTs is adjacent to at least one adjacent IDT.

Aspect 14. The apparatus of Aspect 13, wherein a first busbar of each of the plurality of additional IDTs is coupled to a reference node; and wherein a second busbar of each of the plurality of additional IDTs is either coupled to an input node or an output node.

Aspect 15. The apparatus of Aspect 13, wherein busbars of the plurality of additional IDTs coupled to the input node are adjacent to busbars of the plurality of additional IDTs coupled to the reference node; and wherein busbars of the plurality of additional IDTs coupled to the output node are adjacent to busbars of the plurality of additional IDTs coupled to the reference node.

Aspect 16. The apparatus of Aspect 13, wherein busbars of the plurality of additional IDTs coupled to the input node are adjacent to busbars of the plurality of additional IDTs coupled to the output node; and wherein busbars of the plurality of additional IDTs coupled to the reference node are adjacent to busbars of the plurality of additional IDTs coupled to the reference node.

Aspect 17. The apparatus of any of Aspects 13 to 16, wherein the first IDT, the second IDT, and the plurality of additional IDTs consists of 15 or fewer IDTs.

Aspect 18. The apparatus of any of Aspects 1 to 17, wherein each IDT of the DMS resonator has a corresponding different chirp configuration than electrode fingers of adjacent IDTs.

Aspect 19. The apparatus of any of Aspects 1 to 18, wherein the DMS resonator is disposed in a first DMS resonator element having an input node connection and an output node connection for each IDT.

Aspect 20. The apparatus of Aspect 19, wherein at least a first output node of the first DMS resonator element is electrically coupled to at least a first input node of a second DMS resonator element as part of a DMS resonator image-impedance circuit.

Aspect 21. The apparatus of any of Aspects 18 to 20, wherein: the first DMS resonator element is associated with a different DMS resonator configuration than a DMS resonator configuration associated with the second DMS resonator element; and the DMS resonator configuration associated with the second DMS resonator element and the different DMS resonator configuration associated with the first DMS resonator element are configured for an impedance match with susceptance close to zero at an inner reference plane connection between at least the first output node of the first DMS resonator element and at least the first input node of the second DMS resonator element.

Aspect 22. The apparatus of any of Aspects 19 to 21, wherein: at least the first output node of the first DMS resonator element and at least a first input node of the first DMS resonator element are coupled via a first capacitor; and at least the first input node of the second DMS resonator element and at least a first output node of the second DMS resonator element are coupled via a second capacitor.

Aspect 23. The apparatus of Aspect 22, wherein the first capacitor has a capacitance value between 0 and 1 picofarad (pF) selected to fine tune an antiresonance frequency of a mode of the DMS resonator.

Aspect 24. The apparatus of any of Aspects 1 to 23, wherein the DMS resonator is used in a transmission filter of a wireless communication apparatus configured for a power handling of at least 24 decibels (dBm).

Aspect 25. The apparatus of any of Aspects 1 to 24, wherein the DMS resonator is disposed in a filter of a wireless communication apparatus.

Aspect 26. An apparatus comprising: a dual mode surface acoustic wave (DMS) resonator, comprising: a piezoelectric material; a first reflector disposed over the piezoelectric material; a second reflector disposed over the piezoelectric material; a plurality of interdigitated transducers (IDTs) disposed over the piezoelectric material and positioned between the first reflector and the second reflector, wherein a magnitude of a pitch of electrode fingers in the first reflector and the second reflector is higher than a pitch of electrode fingers in the plurality of interdigitated transducers, wherein a variation of the pitch of the electrode fingers in the plurality of interdigitated transducers is less than 3% across the plurality of interdigitated transducers.

Aspect 27. The apparatus of Aspect 26, wherein a metallization ratio of electrode fingers in transition regions formed by a subset of five or fewer fingers on either side of adjacent IDTs of the plurality of IDTs is greater than a metallization ratio of electrode fingers that are outside the transition regions.

Aspect 28. An apparatus comprising: a dual mode surface acoustic wave (DMS) resonator, comprising: a piezoelectric material; a first reflector disposed over the piezoelectric material; a second reflector disposed over the piezoelectric material; a plurality of interdigitated transducers (IDTs) disposed over the piezoelectric material and positioned between the first reflector and the second reflector, wherein electrode fingers along the plurality of interdigitated transducers are formed to have a pitch profile along the plurality of interdigitated transducers that opposes formation of cavity resonance modes between adjacent interdigitated transducers of the plurality of transducers.

Aspect 29. The apparatus of Aspect 28, wherein the pitch profile corresponds to near constant pitch with a change in pitch along the plurality of interdigitated transducers that is greater than zero and less than 3%.

Aspect 30. The apparatus of any of Aspects 1 to 29, wherein a magnitude of a pitch of 1 first reflector and 1 second reflector is greater than a magnitude of the pitch along the plurality of interdigitated transducers.

Aspect 31. The apparatus of any of Aspects 1 to 30, wherein a metallization ratio of electrode fingers in transition regions formed by a subset of fingers on either side of adjacent IDTs is lower or greater than a metallization ratio of electrode fingers that are outside the transition regions.

Aspect 32. A method comprising: exciting an input node of a dual mode surface acoustic wave (DMS) resonator with a signal associated with a communication band, wherein the DMS resonator comprises: a piezoelectric material; a first reflector disposed over the piezoelectric material; a second reflector disposed over the piezoelectric material; and a plurality of interdigitated transducers (IDTs) disposed over the piezoelectric material and positioned between the first reflector and the second reflector, wherein a magnitude of a pitch of electrode fingers in the first reflector and the second reflector is higher than a pitch of electrode fingers in the plurality of interdigitated transducers, wherein a variation of the pitch of the electrode fingers in the plurality of interdigitated transducers is less than 3% across the plurality of interdigitated transducers, wherein the input node is coupled to first busbars of a first subset of the plurality of IDTs, and wherein second busbars opposite the first busbars of the first subset of the plurality of IDTs are coupled to a reference node; filtering the signal using the plurality of IDTs to generate a filtered signal; and outputting the filtered signal at an output node of the DMS resonator, wherein the output node is coupled to first busbars of a second subset of the plurality of IDTs, wherein second busbars opposite the first busbars of the second subset of the plurality of IDTs are coupled to the reference node, and wherein each IDT of the first subset of IDTs is adjacent to an IDT of the second subset of IDTs.

Aspect 33. The method of aspect 32 performed using any apparatus of aspects 1-31 above.

What is claimed is:

1. An apparatus comprising:
   a dual mode surface acoustic wave (DMS) resonator, comprising:
     a piezoelectric material;
     a first interdigital transducer (IDT) disposed over a surface of the piezoelectric material, the first IDT comprising:
       a first busbar;
       a second busbar parallel to the first busbar; and
       a first plurality of IDT electrode fingers comprising first IDT electrode fingers extending from the first busbar toward the second busbar and second IDT electrode fingers extending from the second busbar toward the first busbar in an interdigitated configuration; and
     a second IDT disposed over the surface of the piezoelectric material adjacent to the first IDT along an interface region between the first IDT and the second IDT, the second IDT comprising:
       a third busbar;
       a fourth busbar parallel to the third busbar; and
       a second plurality of IDT electrode fingers comprising third IDT electrode fingers extending from the third busbar toward the fourth busbar and fourth IDT electrode fingers extending from the fourth busbar toward the third busbar in the interdigitated configuration;
     wherein the first IDT and the second IDT each include a transition region comprising five or fewer electrode fingers nearest the interface region, and wherein a chirp variation in the transition region is not zero, and wherein the chirp variation in the transition region is less than plus or minus three percent.

2. The apparatus of claim 1, wherein the five or fewer electrode fingers have a transition area metallization ratio lower than a metallization ratio of electrode fingers of the first IDT and the second IDT outside the transition region.

3. The apparatus of claim 2, wherein the transition area metallization ratio is within fifteen percent of the metallization ratio of the electrode fingers outside the transition region.

4. The apparatus of claim 1, wherein the five or fewer electrode fingers have a transition area metallization ratio greater than a metallization ratio of electrode fingers of the first IDT and the second IDT outside the transition region.

5. The apparatus of claim 1, wherein:
   the first plurality of IDT electrode fingers consists of between 7 and 15 electrode fingers; and
   the second plurality of IDT electrode fingers consists of between 7 and 15 electrode fingers.

6. The apparatus of claim 1, wherein an electroacoustic cavity resonance around the first interface region between the first IDT and the second IDT is below a threshold value to limit localized energy in the transition region.

7. The apparatus of claim 5, wherein a level of self-harmonic generated power in the apparatus is comparable to a level of self-harmonic generated power of a pure ladder section using a same stack with comparable insertion loss and attenuation performance.

8. The apparatus of claim 1, further comprising:
   a first IDT reflector;
   a second IDT reflector, wherein the first IDT and the second IDT are disposed between the first IDT reflector and the second IDT reflector.

9. The apparatus of claim 8, wherein a second mode of the DMS resonator is defined by a distance between the first IDT reflector and the second IDT reflector.

10. The apparatus of claim 9, wherein a passband of a filter formed by the DMS resonator is substantially formed based on an acoustic wave formed by the second mode between the first IDT reflector and the second IDT reflector.

11. The apparatus of claim 10, wherein a passband of a filter formed by the DMS resonator is substantially based on an acoustic wave formed by a first mode and the second mode.

12. The apparatus of claim 1, further comprising a third IDT adjacent to the second IDT on an opposite side from the first IDT.

13. The apparatus of claim 1, further comprising a plurality of additional IDTs positioned with busbars along shared lines with the busbars of the first IDT and the second IDT, wherein each IDT of the plurality of additional IDTs is adjacent to at least one adjacent IDT.

14. The apparatus of claim 13, wherein a first busbar of each of the plurality of additional IDTs is coupled to a reference node; and
wherein a second busbar of each of the plurality of additional IDTs is either coupled to an input node or an output node.

15. The apparatus of claim 14, wherein busbars of the plurality of additional IDTs coupled to the input node are adjacent to busbars of the plurality of additional IDTs coupled to the reference node; and
wherein busbars of the plurality of additional IDTs coupled to the output node are adjacent to busbars of the plurality of additional IDTs coupled to the reference node.

16. The apparatus of claim 14, wherein busbars of the plurality of additional IDTs coupled to the input node are adjacent to busbars of the plurality of additional IDTs coupled to the output node; and
wherein busbars of the plurality of additional IDTs coupled to the reference node are adjacent to busbars of the plurality of additional IDTs coupled to the reference node.

17. The apparatus of claim 13, wherein the first IDT, the second IDT, and the plurality of additional IDTs includes 15 or fewer IDTs.

18. The apparatus of claim 13, wherein each IDT of the DMS resonator has a corresponding different chirp configuration than electrode fingers of adjacent IDTs.

19. The apparatus of claim 13, wherein the DMS resonator is disposed in a first DMS resonator element having an input node connection and an output node connection for each IDT.

20. The apparatus of claim 19, wherein at least a first output node of the first DMS resonator element is electrically coupled to at least a first input node of a second DMS resonator element as part of a DMS resonator image-impedance circuit.

21. The apparatus of claim 20, wherein:
the first DMS resonator element is associated with a different DMS resonator configuration than a DMS resonator configuration associated with the second DMS resonator element; and
the DMS resonator configuration associated with the second DMS resonator element and the different DMS resonator configuration associated with the first DMS resonator element are configured for an impedance match with susceptance close to zero at an inner reference plane connection between at least the first output node of the first DMS resonator element and at least the first input node of the second DMS resonator element.

22. The apparatus of claim 20, wherein:
at least the first output node of the first DMS resonator element and at least a first input node of the first DMS resonator element are coupled via a first capacitor; and
at least the first input node of the second DMS resonator element and at least a first output node of the second DMS resonator element are coupled via a second capacitor.

23. The apparatus of claim 22, wherein the first capacitor has a capacitance value between 0 and 1 picofarad (pF) selected to fine tune an antiresonance frequency of a mode of the DMS resonator.

24. The apparatus of claim 1, wherein the DMS resonator is used in a transmission filter of a wireless communication apparatus configured for a power handling of at least 24 decibels (dBm).

25. An apparatus comprising:
a dual mode surface acoustic wave (DMS) resonator, comprising:
a piezoelectric material;
a first reflector disposed over the piezoelectric material;
a second reflector disposed over the piezoelectric material;
a plurality of interdigitated transducers (IDTs) disposed over the piezoelectric material and positioned between the first reflector and the second reflector, wherein a magnitude of a pitch of electrode fingers in the first reflector and the second reflector is higher than a pitch of electrode fingers in the plurality of interdigitated transducers, wherein a variation of the pitch of the electrode fingers in the plurality of interdigitated transducers is less than 3% across the plurality of interdigitated transducers.

26. The apparatus of claim 25, wherein a metallization ratio of electrode fingers in transition regions formed by a subset of five or fewer fingers on either side of adjacent IDTs of the plurality of IDTs is greater than a metallization ratio of electrode fingers that are outside the transition regions.

27. An apparatus comprising:
a dual mode surface acoustic wave (DMS) resonator, comprising:
a piezoelectric material;
a first reflector disposed over the piezoelectric material;
a second reflector disposed over the piezoelectric material;
a plurality of interdigitated transducers (IDTs) disposed over the piezoelectric material and positioned between the first reflector and the second reflector, wherein electrode fingers along the plurality of interdigitated transducers are formed to have a pitch profile along the plurality of interdigitated transducers that opposes formation of cavity resonance modes between adjacent interdigitated transducers of the plurality of transducers.

28. The apparatus of claim 27, wherein the pitch profile corresponds to near constant pitch with a change in pitch along the plurality of interdigitated transducers that is greater than zero and less than 3%.

29. The apparatus of claim 27, wherein a magnitude of a pitch of the first reflector and the second reflector is greater than a magnitude of the pitch along the plurality of interdigitated transducers.

30. The apparatus of claim 27, wherein a metallization ratio of electrode fingers in transition regions formed by a subset of fingers on either side of adjacent IDTs of the plurality of IDTs is lower or greater than a metallization ratio of electrode fingers that are outside the transition regions.

* * * * *